(12) United States Patent
Mitsuishi et al.

(10) Patent No.: US 12,107,068 B2
(45) Date of Patent: Oct. 1, 2024

(54) METHOD AND DEVICE FOR MANUFACTURING STACKED SUBSTRATE

(71) Applicant: NIKON CORPORATION, Tokyo (JP)

(72) Inventors: Hajime Mitsuishi, Tokyo (JP); Isao Sugaya, Tokyo (JP)

(73) Assignee: Nikon Corporation, Tokyo (JP)

( * ) Notice: Subject to any disclaimer, the term of this patent is extended or adjusted under 35 U.S.C. 154(b) by 148 days.

(21) Appl. No.: 16/885,041

(22) Filed: May 27, 2020

(65) Prior Publication Data
US 2020/0286851 A1 Sep. 10, 2020

Related U.S. Application Data

(63) Continuation of application No. PCT/JP2018/039249, filed on Oct. 22, 2018.

(30) Foreign Application Priority Data

Nov. 28, 2017 (JP) ................................ 2017-228012

(51) Int. Cl.
*H01L 23/00* (2006.01)
*H01L 21/68* (2006.01)

(52) U.S. Cl.
CPC .............. *H01L 24/80* (2013.01); *H01L 21/68* (2013.01); *H01L 2224/80121* (2013.01)

(58) Field of Classification Search
CPC ...................... H01L 24/80; H01L 21/68; H01L 2224/80121; H01L 21/67288; H01L 21/02; H01L 21/67092; H01L 21/681; H01L 21/185; H05K 3/46
See application file for complete search history.

(56) References Cited

U.S. PATENT DOCUMENTS

| | | | | |
|---|---|---|---|---|
| 5,656,402 | A | * | 8/1997 | Kasuga ..................... G03F 9/70 356/399 |
| 6,214,692 | B1 | * | 4/2001 | Thallner ........... H01L 21/67092 438/258 |
| 2005/0246915 | A1 | * | 11/2005 | Lu ........................... H01L 21/68 33/645 |

(Continued)

FOREIGN PATENT DOCUMENTS

| JP | 2007 158200 A | 6/2007 |
|---|---|---|
| JP | 2012-004307 A | 1/2012 |

(Continued)

OTHER PUBLICATIONS

Decision of Refusal from the Japanese Patent Office, issued in the counterpart Japanese Patent Application No. 2019-557068 mailed on Jan. 11, 2022.

(Continued)

*Primary Examiner* — Jarrett J Stark
(74) *Attorney, Agent, or Firm* — Finnegan, Henderson, Farabow, Garrett & Dunner, L.L.P.

(57) ABSTRACT

A manufacturing method is provided, which includes processing at least one of a plurality of substrates; stacking the plurality of substrates to manufacture a stacked substrate; and correcting, in the processing, a part of an amount of positional misalignment that is generated among a plurality of substrates in the stacking and correcting, in the stacking, at least a part of the remainder of the amount of positional misalignment.

25 Claims, 23 Drawing Sheets

(56) References Cited

U.S. PATENT DOCUMENTS

| | | | |
|---|---|---|---|
| 2013/0161900 A1 | 6/2013 | Takahashi et al. | |
| 2015/0205213 A1* | 7/2015 | Cekli | G03F 7/70258 355/67 |
| 2017/0278803 A1* | 9/2017 | Sugaya | B65H 31/34 |
| 2019/0043826 A1 | 2/2019 | Sugaya et al. | |
| 2019/0148184 A1* | 5/2019 | Sugaya | H01L 21/67271 438/455 |

FOREIGN PATENT DOCUMENTS

| | | | | |
|---|---|---|---|---|
| JP | 2013-008804 A | 1/2013 | | |
| JP | 2013-147351 A | 8/2013 | | |
| JP | 2014-216496 A | 11/2014 | | |
| JP | 2014-226905 A | 12/2014 | | |
| JP | 2017-105294 A | 6/2017 | | |
| KR | 10-2017-0094327 | 8/2017 | | |
| KR | 20220066912 A * | 5/2022 | | |
| WO | WO-2014035348 A1 * | 3/2014 | ........ | B25J 11/0095 |
| WO | WO-2016093284 A1 * | 6/2016 | ........ | B23K 20/002 |
| WO | WO 2017/168534 A1 | 10/2017 | | |

OTHER PUBLICATIONS

Notification of Reason for Refusal from the Korean Patent Office, issued in the counterpart Korean Patent Application No. 10-2020-7013544 mailed on Aug. 26, 2021.

International Search Report of International Application No. PCT/JP2018/039249 dated Nov. 27, 2018.

Notice of Reasons for Refusal from the Japanese Patent Office, issued in the counterpart Japanese Patent Application No. 2019-557068 mailed on Apr. 27, 2021.

Notice of Final Rejection from the Korean Patent Office, issued in the counterpart Korean Patent Application No. 10-2020-7013544 mailed on Mar. 28, 2022.

Written Opinion of the International Searching Authority for International Application No. PCT/JP2018/039249, mailed Nov. 27, 2018.

International Preliminary Report on Patentability, in corresponding international application No. PCT/JP2018/039249, mailed Jun. 2, 2020.

Office Action issued by the Taiwanese Patent Office on Apr. 18, 2023 in counterpart Taiwanese Patent Application No. 107140127, and English Translation thereof.

Request for the Submission of an Opinion from the Korean Patent Office, issued in the counterpart Korean Patent Application No. 10-2022-7017544 mailed on Feb. 3, 2023.

Office Action issued by the Japanese Patent Office and mailed on Mar. 14, 2023 in counterpart Japanese Patent Application No. 2022-064534, and English Translation thereof.

Office Action issued by the Chinese Patent Office and mailed on Mar. 10, 2023 in counterpart Chinese Patent Application No. 201880076998.X, and English Translation thereof.

Computer-generated English translation of WO 2016/093284 A1.

Computer-generated English translation of JP 2013147351 A.

Computer-generated English translation of JP 2017105294 A.

Computer-generated English translation of JP 2012004307 A.

Computer-generated English translation of JP 2013008804 A.

Computer-generated English translation of JP 2014226905 A.

Office Action issued by the China National Intellectual Property Administration on Aug. 9, 2023, in counterpart Chinese Patent Application No. 201880076998.X, and English Translation thereof.

Office Action from the Taiwan Intellectual Property Office, issued in the counterpart Taiwanese Patent Application No. 107140127 mailed on Apr. 19, 2022.

Office Action issued by the Japanese Patent Office and mailed on Oct. 10, 2023 in counterpart Japanese Patent Application No. 2022-064534, and English Translation thereof.

Office Action issued by the Taiwanese Patent Office and mailed on Oct. 13, 2023 in counterpart Taiwanese Patent Application No. 107140127, and English Translation thereof.

Notice of Final Rejection from the Korean Patent Office, issued in the counterpart Korean Patent Application No. 10-2022-7017544 mailed on Oct. 29, 2023.

Office Action issued by the China National Intellectual Property Administration on Dec. 21, 2023, in counterpart Chinese Patent Application No. 201880076998.X, and English Translation thereof.

* cited by examiner

METHOD AND DEVICE FOR MANUFACTURING STACKED SUBSTRATE

The contents of the following Japanese and International patent application are incorporated herein by reference:
No. 2017-228012 filed on Nov. 28, 2017, and
No. PCT/JP2018/039249 filed on Oct. 22, 2018.

BACKGROUND

1. Technical Field

The present invention relates to a method and a device for manufacturing a stacked substrate.

2. Related Art

Known is technology of stacking a plurality of substrates to form a stacked substrate.
Patent Document 1: Japanese Patent Application Publication No. 2014-216496
In the stacked substrate, positional misalignment among the substrates is generated due to a variety of causes. Therefore, in order to obtain predetermined positional alignment accuracy, it is necessary to correct diverse types of positional misalignment components.

GENERAL DISCLOSURE

A first aspect of the present invention provides a manufacturing method comprising processing at least one of a plurality of substrates; stacking the plurality of substrates to manufacture a stacked substrate; and correcting, in the processing, a part of an amount of positional misalignment that is generated among a plurality of substrates in the stacking, and correcting, in the stacking, at least a part of the remainder of the amount of positional misalignment.

A second aspect of the present invention provides a manufacturing method comprising processing at least one of a plurality of substrates; stacking the plurality of substrates to manufacture a stacked substrate; and deciding a correction amount, based on an amount of positional misalignment among a plurality of substrates of each of a plurality of stacked substrates, wherein at least one of the processing and the stacking includes correcting, by the correction amount, at least one of a plurality of substrates to be stacked after the deciding.

A third aspect of the present invention provides a manufacturing method comprising processing at least one of a plurality of substrates, wherein the processing includes correcting, by a correction amount decided based on an amount of positional misalignment among a plurality of substrates of each of a plurality of stacked substrates each having a plurality of substrates stacked, at least one of a plurality of substrates to be stacked after the deciding.

A fourth aspect of the present invention provides a manufacturing method comprising stacking a plurality of substrates to manufacture a stacked substrate, wherein the stacking includes correcting, by a correction amount decided based on an amount of positional misalignment among a plurality of substrates of each of a plurality of stacked substrates, at least one of a plurality of substrates to be stacked after the deciding.

A fifth aspect of the present invention provides a manufacturing device comprising a processing unit that processes at least one of a plurality of substrates; and a stacking unit that stacks the plurality of substrates to manufacture a stacked substrate, wherein a part of an amount of positional misalignment that is generated among a plurality of substrates in the stacking unit is corrected in the processing unit, and at least a part of the remainder of the amount of positional misalignment is corrected in the stacking unit.

A sixth aspect of the present invention provides a manufacturing device comprising a processing unit that processes at least one of a plurality of substrates; and a stacking unit that stacks the plurality of substrates to manufacture a stacked substrate, wherein at least one of the processing unit and the stacking unit corrects, by a correction amount decided based on an amount of positional misalignment among a plurality of substrates of each of a plurality of stacked substrates, at least one of a plurality of substrates to be stacked after the deciding.

A seventh aspect of the present invention provides a manufacturing device comprising a processing unit that processes at least one of a plurality of substrates, wherein the processing unit corrects, by a correction amount decided based on an amount of positional misalignment among a plurality of substrates of each of a plurality of stacked substrates each having a plurality of substrates stacked one on top of another, at least one of a plurality of substrates to be stacked after the deciding.

An eighth aspect of the present invention provides a manufacturing device comprising a stacking unit that stacks a plurality of substrates to manufacture a stacked substrate, wherein the stacking unit corrects, by a correction amount decided based on an amount of positional misalignment among a plurality of substrates of each of a plurality of stacked substrates, at least one of a plurality of substrates to be stacked after the deciding.

The summary of the present invention does not necessarily describe all necessary features of the present invention. The present invention may also be a sub-combination of the features described above.

DESCRIPTION OF EXEMPLARY EMBODIMENTS

Hereinafter, some embodiments of the present invention will be described. The embodiments do not limit the invention defined in the claims. All combinations of features described in the embodiments are not necessarily essential to solving means of the invention.

Figure 1:
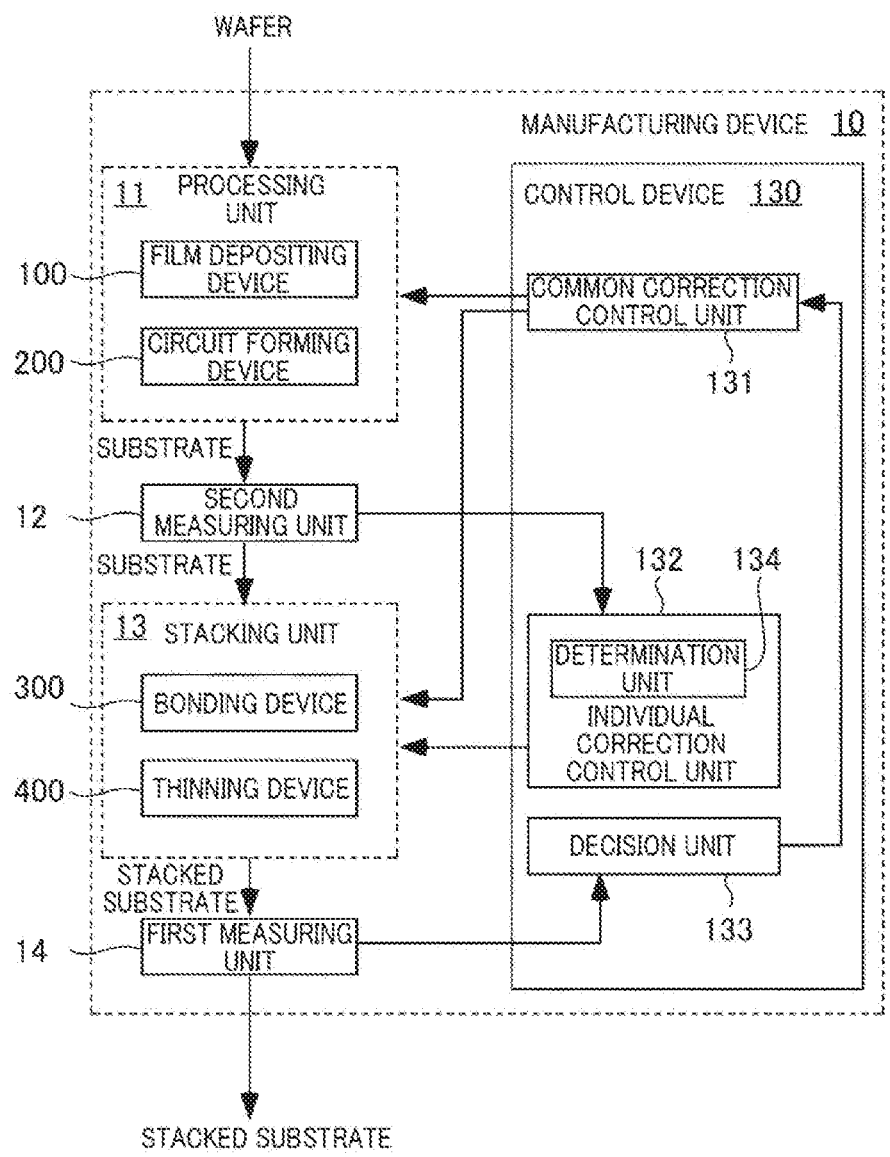
FIG. 1 is a block diagram showing an entire configuration of a manufacturing device 10.

FIG. 1 is a block diagram showing an entire configuration of a manufacturing device 10 of a stacked substrate. The manufacturing device 10 includes a processing unit 11, a second measuring unit 12, a stacking unit 13, a first measuring unit 14, and a control device 130.

The processing unit 11 includes a film depositing device 100 and a circuit forming device 200. The film depositing device 100 forms a functional layer or a sacrificial layer on a substrate by a method such as CVD (Chemical Vapor Deposition). The circuit forming device 200 performs patterning of a functional layer or sacrificial layer which is a film deposited on the substrate using patterning technology such as photolithography, to form an element, wiring and the like. By repeating the above operations, the processing unit 11 processes a plurality of substrates, which were each originally in a state of a bare wafer, to form structures such as a circuit, and repeatedly manufactures the substrates which form a stacked substrate. Meanwhile, in descriptions below, "processing" of the substrate means forming structures such as wiring, a circuit, a protection film and the like on the substrate by performing processing such as film deposition, patterning and the like on the substrate. Also, as used herein, the substrate includes a substrate on which structures such as wiring, a circuit, a protection film and the like are already formed, in addition to a single crystal wafer of silicon, compound semiconductor or the like.

As the circuit forming device 200, an exposure device, an electron beam lithography device, a nanoimprint device and the like may be used. Also, the processing unit 11 may further include other devices that are used when processing the substrate to be a part of the stacked substrate with photolithography technology. As the other devices, a coater that applies resist onto the substrate, a wet etching device or a dry etching device that removes a part of the structure on the substrate, and the like may also be exemplified.

The film depositing device 100 can change characteristics of a thin film to be deposited by changing conditions relating to film deposition, for example, a substrate temperature, an applied voltage, a composition of a raw material gas, and the like. Also, the circuit forming device 200 can change a shape and a size of a pattern that is formed by patterning by optical or mechanical adjustment. Therefore, the film depositing device 100 and the circuit forming device 200 can also be used as a correction device that corrects a substrate.

The film depositing device 100 and the circuit forming device 200 have manufacturing errors with respect to film deposition and circuit formation. Also, when an exposure device is used as the circuit forming device 200, patterning over a large area is performed by performing repeatedly exposure with one reticle. In this case, even though the exposure is performed with the same reticle, different distortions may be caused in patterns formed for different shots. For this reason, even when the substrates are processed in the processing unit 11 with the same recipe, individual differences occurs in the processed substrates. The individual differences may also cause the positional misalignment of the substrates in the stacked substrate.

The second measuring unit 12 measures distortion of the substrate that is carried into the stacking unit 13. The distortion of the substrate influences an amount of positional misalignment in the stacked substrate formed by stacking substrates. The second measuring unit 12 may be provided independently of the stacking unit 13 but may also be served as a measuring device that is used for positional alignment by the bonding device 300.

Herein, the distortion of the substrate shows up as displacement from a design coordinate, i.e., a design position, of a structure such as an element, wiring and the like on the substrate. The distortion that is generated in the substrate includes two-dimensional distortion and three-dimensional distortion. Regarding the positional misalignment due to the distortion, the positional misalignment between the substrates cannot be eliminated even if movement in the bonding surface along a plane direction (X-Y direction) and rotation angle (θ) in the bonding surface are adjusted.

The two-dimensional distortion refers to displacement of a structure that is generated along a bonding surface between one substrate and another substrate. The two-dimensional distortion includes linear distortion causing displacement from the design position that can be expressed by linear transformation, and non-linear distortion that is any other distortion. As the linear distortion, distortion marked by a magnification in which an amount of displacement increases at a constant increase rate in a constant direction, for example, outward from a center in a radial direction may be exemplified.

The magnification is a value (unit: ppm) obtained by dividing an amount of misalignment from a design value at a distance X from the center of a substrate by the distance X. The magnification includes an isotropic magnification in which a displacement vector from the design position has X and Y components of the same magnitude, and an anisotropic magnification in which a displacement vector from the design position has components with magnitudes different from each other. When bonding substrates to manufacture a stacked substrate, a difference of magnifications of two substrates obtained with the design position of each substrate as a reference is an amount of positional misalignment of the two substrates in the stacked substrate.

Further, a change in magnification of the substrate caused due to distortion can be classified into an initial magnification, a flattening magnification, and a bonding process magnification, in accordance with causes of occurrence. The initial magnification is caused due to stress that is generated in a process of forming structures such as an element, wiring and the like on a wafer, anisotropy due to the crystal orientation of a substrate, a difference of stiffness of structures formed on the substrate, and the like, and can be known before substrates are bonded to form a stacked substrate.

The flattening magnification is caused due to a change in magnification that is caused due to a change in state of warpage of a substrate having distortion such as the warpage developed therein when the substrate is bonded to another substrate. Also, the flattening magnification is caused due to a change in state of warpage that is developed when the substrate is sucked to a flat holder for bonding. The bonding process magnification is a change in magnification that is generated when a state of a substrate is changed in a process of bonding substrates. Therefore, the bonding process magnification may include at least a part of the flattening magnification.

The changes in the flattening magnification and the bonding process magnification are generated after the bonding of the substrates is started, and are fixed at the time when the stacked substrate is formed. The flattening magnification and the bonding process magnification can be calculated from states of the distortion of the substrate including an amount of warpage and a shape of warpage by examining in advance a correlation between a state of a substrate before the bonding, which includes information about deformation such as warpage, and a change in magnification caused when the substrate is flattened or bonded.

The linear distortion includes orthogonal distortion. The orthogonal distortion is distortion that causes displacement in parallel to an X-axis direction from a design position by a larger amount as a structure is more distant in a Y-axis direction from an origin, where the X-axis and the Y-axis intersect at right angles at the origin that is the center of the substrate. The amount of displacement is the same in each of a plurality of regions located on a line parallel to the X-axis and crossing the Y-axis, and an absolute value of the amount of displacement becomes larger away from the X-axis. Also, for the orthogonal distortion, a direction of displacement on a positive side of the Y-axis and a direction of displacement on a negative side of the Y-axis are opposite to each other.

The three-dimensional distortion of the substrate is displacement in a direction other than a direction along a bonding surface of a substrate, i.e., in a direction intersecting with the bonding surface. The three-dimensional distortion includes a bend that is generated in all or a part of a substrate as the substrate is bent entirely or partially. As used herein, the description "substrate is bent" means that the substrate is changed into a shape in which the surface of the substrate includes a point not present on a plane specified by three points on the substrate.

Also, the bend is distortion by which a surface of the substrate has a curved surface, and includes warpage of the substrate, for example. In the present embodiment, the warpage means distortion that remains in the substrate in a state the influence of gravity is excluded. Distortion of the substrate in which the influence of gravity is applied to the warpage is referred to as deflection. The warpage of the substrate includes global warpage in which the entire substrate is curved with a substantially uniform curvature and local warpage in which a local change in curvature occurs in a part of the substrate.

The stacking unit 13 includes a bonding device 300 and a thinning device 400. The bonding device 300 has functions of executing positional alignment of substrates based on alignment marks formed on the substrates, and bonding the aligned substrates to form a stacked substrate.

As used herein, "bonding" means permanently integrating two superimposed substrates so as to obtain bonding strength greater than a preset value. Also, "bonding" includes, when substrates to be bonded have electrical connection terminals, electrically connecting the connection terminals of two substrates each other to secure electrical conduction between the substrates.

Also, when the bonding is performed by a bonding method of increasing the bonding strength of the substrates to a preset value by annealing and the like or when an electrical connection between the substrates is made by annealing and the like, a state before the annealing and in which the two substrates are temporarily connected, i.e., a temporarily bonded state may also be described as the bonded state, in some cases. In this case, the temporarily bonded substrates may be separated and reused without being damaged.

The thinning device 400 thins one surface of the stacked substrate formed by the bonding device 300 or one surface of the substrates to be stacked by the bonding device 300, by chemical mechanical polishing or the like. Thereby, the wiring, the element and the like that were positioned inside the stacked substrate upon completion of stacking or inside the single substrate can be partly positioned in the vicinity of the surface of the stacked substrate or the substrate or may be exposed on the surface.

Thereby, an internal circuit of the stacked substrate can be connected to a lead frame and the like. Also, light can be allowed to be incident on a light-receiving element formed in the substrate. Also, another substrate can be additionally stacked on the stacked substrate formed by stacking the substrates, so that a stacked substrate of three or more substrates can be manufactured. It should be noted that the thinning by the thinning device 400 may not be required, in some cases.

The first measuring unit 14 measures positional misalignment between the substrates generated in the stacked substrate formed by the stacking unit 13. The first measuring unit 14 may measure only the positional misalignment of the stacked substrate but may also be served as a measuring unit that is used for positional alignment by the bonding device 300.

Again referring to FIG. 1, the manufacturing device 10 includes the control device 130. The control device 130 includes a common correction control unit 131, an individual correction control unit 132, and a decision unit 133.

The common correction control unit 131 causes at least one of the processing unit 11 and the stacking unit 13 to execute correction by indicating correction conditions, so as to correct the substrates by a correction amount decided by the decision unit 133, which will be described later. That is, the common correction control unit 131 forms a correction unit that executes a steady correction by a constant correction amount, in cooperation with at least one of the processing unit 11 and the stacking unit 13, until the decision unit 133 decides a new correction amount.

In the correction that is executed under control of the common correction control unit 131, when processing a plurality of substrates or forming the plurality of stacked substrates, constant correction conditions are repeatedly applied. For this reason, the positional misalignment in the eventually formed stacked substrate is not necessarily reduced below a preset threshold value by the correction under control of the common correction control unit 131 alone.

Herein, the correction conditions that are indicated to at least one of the processing unit 11 and the stacking unit 13 by the common correction control unit 131 include information for designating which of the processing unit 11 and the stacking unit 13 is caused to execute the correction, and information about a correction amount of the correction to be executed. The correction conditions include information about a correction amount, and the information about a correction amount includes at least a part of an amount of positional misalignment generated in a stacked substrate already formed. Such as correction amount is decided by the decision unit 133.

In the meantime, the individual correction control unit 132 decides correction conditions for reducing positional misalignment that is generated in the stacked substrate formed by the stacking unit 13, and indicates the decided correction conditions to at least one of the processing unit 11 and the stacking unit 13. Thereby, at least one of the processing unit 11 and the stacking unit 13 executes individual correction for each substrate, under control of the individual correction control unit 132. That is, the individual correction control unit 132 forms a correction unit that reduces individual positional misalignment in each of the stacked substrates to a threshold value or less, in cooperation with at least one of the processing unit 11 and the stacking unit 13.

Also, the correction conditions that are indicated to at least one of the processing unit 11 and the stacking unit 13 by the individual correction control unit 132 is decided each time the substrate is processed or each time the stacked substrate is formed, based on a measurement result obtained from the second measuring unit. The individual correction control unit 132 may correct individual distortion that is generated due to a processing error of the processing unit 11 and an individual difference of the stacking unit 13 and the like, in addition to the individual difference of the substrate.

The correction that is executed by the individual correction control unit 132 corresponds to a difference between positional misalignment that is individually generated in a specific set of substrates forming one stacked substrate and correction that is executed by a preset correction amount by the common correction control unit 131. Also, there is a limit to the correction amount of each type of correction executed by the individual correction control unit 132. Therefore, when there is room to increase or decrease the amount of the correction that is executed by the common correction control unit 131, the amount of the correction that is executed by the common correction control unit 131 may be decided such that a correction amount remaining after the correction that is executed by the common correction control unit 131 is within a range in which the substrate can be completely corrected by the individual correction control unit 132.

Also, when it is confirmed that large positional misalignment is generated that cannot be corrected in the correction that is executed by the individual correction control unit 132 will be left after the correction by the common correction control unit 131, a completely different countermeasure such as changing substrates to be combined for bonding may be considered. Also, the individual correction control unit 132 may be provided with a determination unit 134 that determines whether it is necessary to perform individual correction for distortion in each of the substrates and may determine, in the first place, the necessity of the individual correction for each substrate, in addition to deciding the correction amount for each substrate.

Whether it is necessary to perform the correction is determined by the determination unit 134, based on whether a measurement result acquired from the second measuring unit 12 is less than a preset threshold value. When it is expected that an amount of positional misalignment in the stacked substrate that is formed with the correction by the correction amount that is executed by the common correction control unit 131 will not exceed a preset threshold value, the individual correction that is executed by the individual correction control unit 132 may be omitted. Also, when a measurement result acquired from the second measuring unit 12 is greater than a preset threshold value, the individual correction control unit 132 may decide a correction method and a correction amount by which the amount of positional misalignment generated in the stacked substrate becomes smaller than the threshold value.

Herein, a threshold value of positional misalignment for deciding whether it is necessary to perform the correction may be an allowable amount of positional misalignment preset for a stacked substrate as a product, for example. Also, the threshold value may be an amount of positional misalignment within a range in which electrical connection is established between substrates in a formed stacked substrate. This is an amount of misalignment when all connection terminals are in at least partial contact with each other between the substrates, and is also a state in which bonding strength enough to keep the contacts of the connection terminals has been established, for example.

Also, for example, the processing unit 11 of the manufacturing device 10 may be provided with the plurality of film depositing devices 100, the plurality of circuit forming devices 200 and the like, and the substrates may be processed in parallel. Also, the stacking unit 13 of the manufacturing device 10 may be provided with the plurality of bonding devices 300 and the plurality of thinning devices 400, and the stacking and thinning of the substrates may be processed in parallel. Further, by adjusting the number of devices to be arranged, the processing speed can be made uniform in the entire manufacturing device 10 and the manufacturing efficiency of the stacked substrate can be thus improved.

Also, since the film depositing device 100, the circuit forming device 200, the bonding device 300, and the thinning device 400 each operate even independently, all of the film depositing device 100, the circuit forming device 200, the bonding device 300, and the thinning device 400 are not required to be arranged at the same place. For example, the processing unit 11 and the stacking unit 13 may be arranged in separate facilities, and the substrates processed in the processing unit 11 may be conveyed to the stacking unit 13 for manufacturing of a stacked substrate.

It should be noted, however, that the control device 130 collectively controls both the processing unit 11 and the stacking unit 13. For this reason, for example, information detected in the stacking unit 13 may be used to control the processing unit 11. Therefore, the control device 130 can preferably communicate with both the processing unit 11 and the stacking unit 13. The communication between the control device 130 and another device may be performed using a public line or dedicated line. Also, information that should be transmitted may be written on the substrate when the substrate is processed in the processing unit 11, and the information read out from the substrate in the stacking unit 13 may be transmitted to the control device 130.

Figure 2:
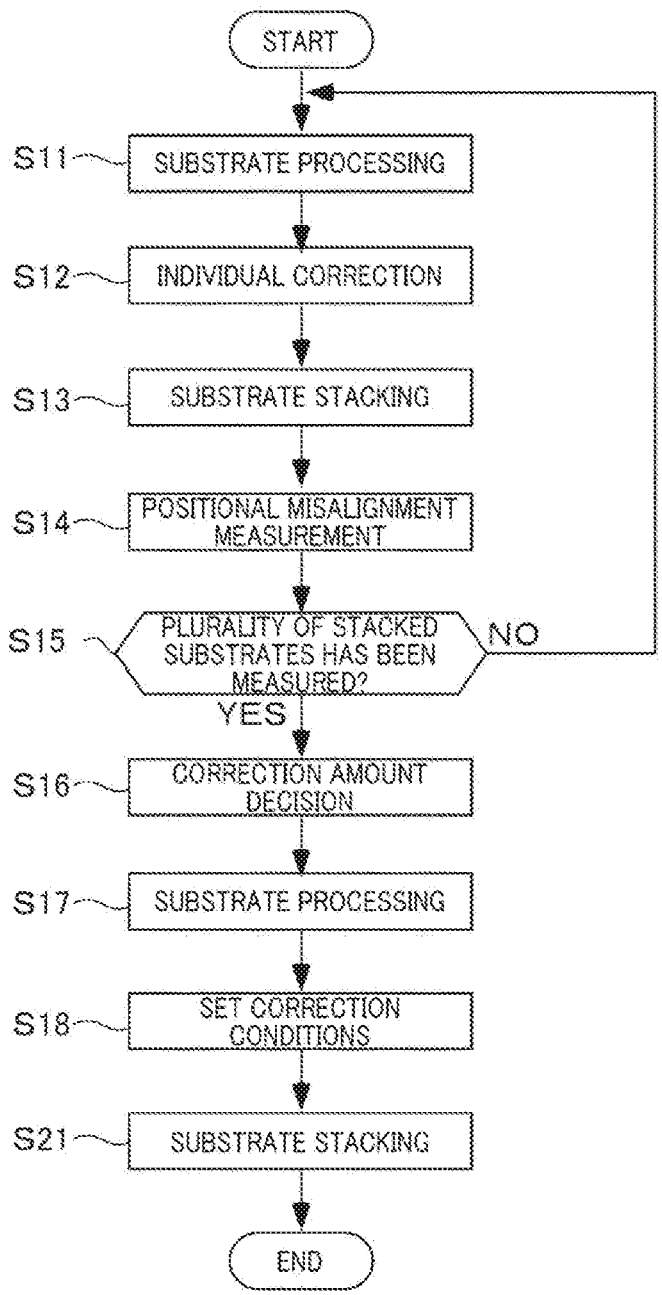
FIG. 2 is a flowchart showing an entire operation sequence of the manufacturing device 10.

FIG. 2 is a schematic flowchart of manufacturing sequence of the stacked substrate by the manufacturing device 10. In the manufacturing device 10, first, the processing unit 11 processes a plurality of substrates (step S11). The number of processed substrates to be manufactured is large enough to produce a plurality of stacked substrates to be processed by bonding at least two substrates.

Then, under control of the individual correction control unit 132, the substrates are individually corrected before carried into the stacking unit 13 (step S12). The correction that is executed in this step is decided for each substrate by the individual correction control unit 132, with reference to a measurement result of the second measuring unit 12.

Then, the stacking unit 13 bonds the substrates with the bonding device 300, thereby forming a stacked substrate (step S13). Also, before the stacked substrate is carried out from the manufacturing device 10, the first measuring unit 14 measures an amount of positional misalignment between the substrates in the formed stacked substrate (step S14).

The operations from step S1 to step S14 are repeated until the plurality of stacked substrates, for example, about two to ten stacked substrates, are formed (step S15: NO), so that the first measuring unit 14 can measure the amounts of positional misalignment generated for the plurality of stacked substrates formed in the stacking unit 13. In this way, when the amount of positional misalignment is measured for the preset number of stacked substrates (step S15: YES), the decision unit 133 refers to the result of measurement by the first measuring unit 14 to calculate and decide a correction amount of correction that is to be executed in at least one of the processing unit 11 and the stacking unit 13 by the common correction control unit 131 so as to reduce the amounts of positional misalignment in the stacked substrates (step S16).

In the present embodiment, an example where the substrates are corrected in both the processing of the substrates in the processing unit 11 and the bonding of the substrates in the stacking unit 13 is described. In this case, the decision unit 133 decides correction to be assigned to the processing unit 11 and correction to be assigned to the stacking unit 13 of the common correction decided in step S16, and outputs the same to the processing unit 11 and the stacking unit 13. The correction that is to be executed in the processing unit 11 and the correction that is to be executed in the stacking unit 13 are assigned based on preset assignment conditions, based on a type of the correction, for example, whether to correct the linear distortion or non-linear distortion and an amount of the correction. The assignment conditions are set in advance based on a test or a simulation, and are stored in a memory of the decision unit 133.

Herein, the correction amount of the correction that the common correction control unit 131 is caused to perform by the decision unit 133 is a correction amount that is commonly applied to the formation of the plurality of stacked substrates when manufacturing the stacked substrates after this point of time. Therefore, first, the substrate processing by the processing unit 11 to which the correction to be executed by the common correction control unit 131 is also added is started (step S17).

Then, correction conditions to be used in stacking by the stacking unit 13 and to which the correction to be executed by the common correction control unit 131 is also added are set (step S18), and the substrates which have been corrected based on the correction conditions are stacked (step S21). The operations from step S17 to step S21 will be described in detail later.

The correction that is commonly executed for the plurality of substrates by the common correction control unit 131 may include correction of positional misalignment that is generated while the substrates are bonded in the stacking unit 13, thus positional misalignment that is not generated yet in this step. Also, the correction that is commonly executed for the plurality of substrates by the common correction control unit 131 may include correction of positional misalignment that is generated when thinning one substrate of the stacked substrate, thus positional misalignment that is not generated yet in the step of the bonding.

However, when correction including a correction amount corresponding to the positional misalignment that is not generated yet is executed by the common correction control unit 131, the individual correction control unit 132 that decides a correction amount immediately before the stacking unit 13 may execute correction which cancels the correction that is executed by the common correction control unit 131. Therefore, when it is decided to correct the positional misalignment to be generated during the bonding before the substrate is carried into the stacking unit 13, the decision unit 133 preferably notifies the individual correction control unit 132 of the correction amount decided for the common correction control unit 131, so as to exclude the correction amount from the target correction to be executed by the individual correction control unit 132.

Also, since the positional misalignment in the stacked substrate is a difference of relative positions between the substrates, one of two substrates to be bonded may be corrected. However, when the correction amount is large, for example, both two substrates to be bonded may be corrected. Also, before the decision unit 133 decides the correction amount of the correction that is executed by the common correction control unit 131, an initial value decided based on a test, an analysis and the like may be set in the common correction control unit 131.

As described above, the decision unit 133 of the manufacturing device 10 assigns, to the common correction control unit 131, control of the correction that is executed, by the common correction amount, when the plurality of stacked substrates is manufactured. Therefore, the correction that is assigned to the common correction control unit 131 is preferably correction of distortion that is a cause of positional misalignment that is stably or steadily generated for every stacked substrate. In other words, the correction that is executed by the common correction control unit 131 is preferably correction of distortion that includes at least a part of the positional misalignment generated in the plurality of stacked substrates and that has high reproducibility when manufacturing the plurality of stacked substrates.

Figure 3:
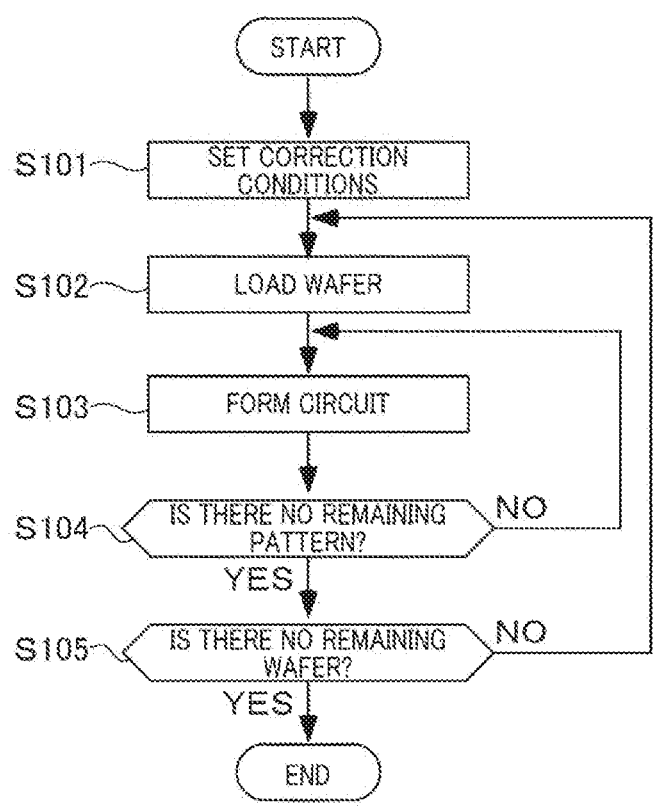
FIG. 3 is a flowchart showing an operation sequence of a processing unit 11.

Subsequently, operations of the respective units of the manufacturing device 10 are individually described. FIG. 3 is a flowchart showing an operation sequence of the processing unit 11 and is also an example of step S17 shown in FIG. 2. For the processing unit 11, first, correction conditions are set so as to execute correction to be executed while the substrate is processed. The correction conditions that are set include a correction method to be executed in the processing unit and a correction amount to be used when the correction method is executed (step S101). The correction conditions that are herein set may be acquired from either of the common correction control unit 131 and the individual correction control unit 132 of the control device 130. In the present embodiment, it is assumed that the correction conditions are acquired from the common correction control unit 131.

Then, a wafer that is a material of the substrate is loaded to the processing unit 11 having the correction conditions set therein (step S102). The wafer that is loaded may be a bare wafer that is not processed yet or a substrate having structures formed thereon and in the process of formation. Then, the processing unit 11 forms structures such as elements, wiring and the like on the wafer through film deposition by the film depositing device 100 and patterning using the circuit forming device 200 while executing the correction set by the control device 130, thereby processing the substrate (step S103).

Then, the control device 130 checks whether to additionally form, on the substrate having the elements or wiring formed thereon, any other elements or wiring (step S104). When there remains a pattern to be formed (step S104: NO), the processing unit 11 repeats the film deposition by the film depositing device 100 and the patterning using the circuit forming device 200 and the like, thereby forming elements or wiring on the substrate.

When there remains no pattern that is to be formed on the substrate (step S104: YES), the control device 130 ends the substrate processing by the processing unit 11, and checks whether there still remains a wafer that, for example, belongs to the same lot and to be formed thereon a circuit next (step S105). Herein, when there remains a wafer on which a circuit is to be formed (step S105: NO), the control device 130 loads the wafer to the processing unit 11 (step S102), and repeats the operations from step S103 to step S105.

When it is determined in step S105 that there remains no wafer on which a circuit is to be formed (step S105: YES), the control device 130 ends the substrate processing by the processing unit 11. In this way, in the processing unit 11, a plurality of substrates is processed with the correction conditions set in step S101.

Figure 4:
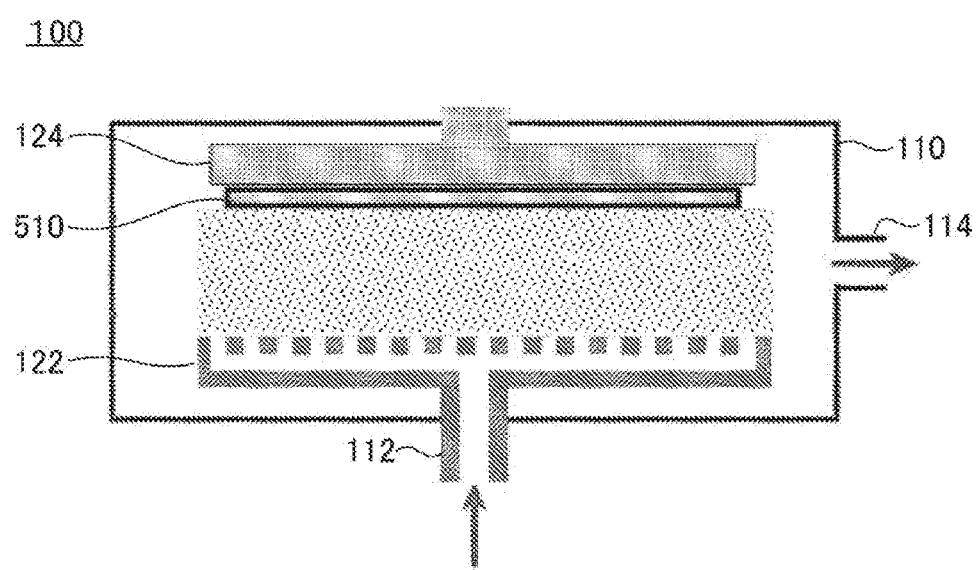
FIG. 4 is a schematic view of a film depositing device 100.

FIG. 4 is a schematic view showing an example of the film depositing device 100 of the processing unit 11. The film depositing device 100 includes a chamber 110 and high-frequency electrodes 122 and 124 arranged in the chamber 110.

The chamber 110 has a supply hole 112 through which a raw material gas flows into, and an exhaust hole 114 from which the raw material gas is discharged. The high-frequency electrode 124, which is arranged on an upper side of FIG. 4, of the pair of high-frequency electrodes 122 and 124 also serves as a substrate holder. Therefore, the film depositing device 100 forms a plasma CVD device that, while supplying the raw material gas into the chamber 110, supplies high-frequency power to the high-frequency electrodes 122 and 124, to expose a substrate 510 to plasma of the raw material gas, thereby allowing a composition originating from the raw material gas to be deposited on a surface of the substrate 510.

Herein, the distortion that is generated in the substrate 510 changes with the change of a flow rate of the raw material gas that is supplied to the film depositing device 100, a power amount of the high-frequency power that is applied to the high-frequency electrodes 122 and 124, a temperature of the substrate, and the like. Therefore, it is possible to correct the substrate in a film deposition step in the processing unit 11 by appropriately setting film deposition conditions for the film depositing device 100.

Figure 5:
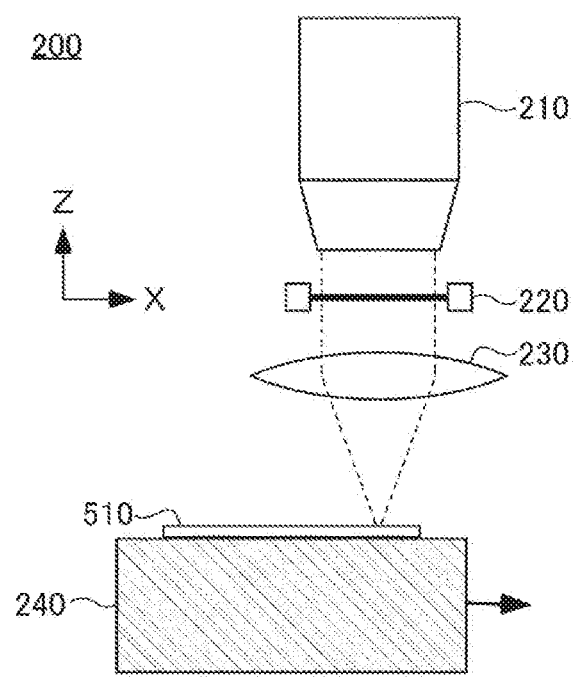
FIG. 5 is a schematic view of a circuit forming device 200.

FIG. 5 is a schematic view showing an example of the circuit forming device 200 of the processing unit 11. The circuit forming device 200 includes a light source 210, a reticle 220, a reduction optics 230, and a moving stage 240. In the circuit forming device 200, the substrate 510 is mounted on the moving stage 240.

In the circuit forming device 200, irradiation light emitted from the light source 210 is applied to the substrate 510 on the moving stage 240 through the reticle 220 and the reduction optics. The reticle 220 has a light-shielding film or transmission holes of a pattern to be formed on the substrate, and changes the light emitted from the light source 210 into a light beam shaped into the pattern.

The reduction optics 230 converges the light beam and irradiates a part of the substrate 510 with the same. Thereby, a resist applied on the substrate 510 is exposed to the light, so that a resist mask having a shape corresponding to the pattern of the reticle 220 is formed on the surface of the substrate 510. Further, the movement of the moving stage 240 and the exposure are repeated, so that a large number of patterns of the reticle 220 can be transferred to the entire surface of the substrate 510. It should be noted that the sacrificial layer such as a resist mask may be formed earlier or later than a functional layer in accordance with characteristics of the structures to be formed on the substrate.

By using the resist mask formed in this way, it is possible to form a functional layer on the surface of the substrate 510 with techniques such as lift-off, etching and the like. In addition, the film deposition and the patterning are repeated, so that a circuit region in which an element and wiring coexist is formed on the substrate 510. Herein, a magnification of the circuit region that is formed on the substrate 510 can be adjusted by changing a reduction rate of the reduction optics 230.

Also, a position on the substrate 510 at which the circuit region is formed can be changed by changing an amount of movement of the moving stage 240. Further, the pattern that is formed on the substrate 510 can be changed by tilting or modifying the reticle 220, for example. In this way, also in the circuit forming device 200, it is possible to change the correction conditions in the processing unit 11.

In the meantime, in the correction in the circuit forming device 200, it may be difficult to finely change the correction conditions for each wafer. Therefore, the correction amount in the circuit forming device 200 may be suitable for correction that is indicated to the common correction control unit 131 by the decision unit 133 and is commonly performed for the plurality of substrates, in many cases.

In the meantime, in the patterning process in the processing unit 11, a dry etching device and the like can also be used, in addition to the circuit forming device 200 including an electron beam lithography device. Also, the processing unit 11 may be further provided with a coater that applies a resist material and the like, an ashing device that removes the resist material, and the like.

Figure 6:
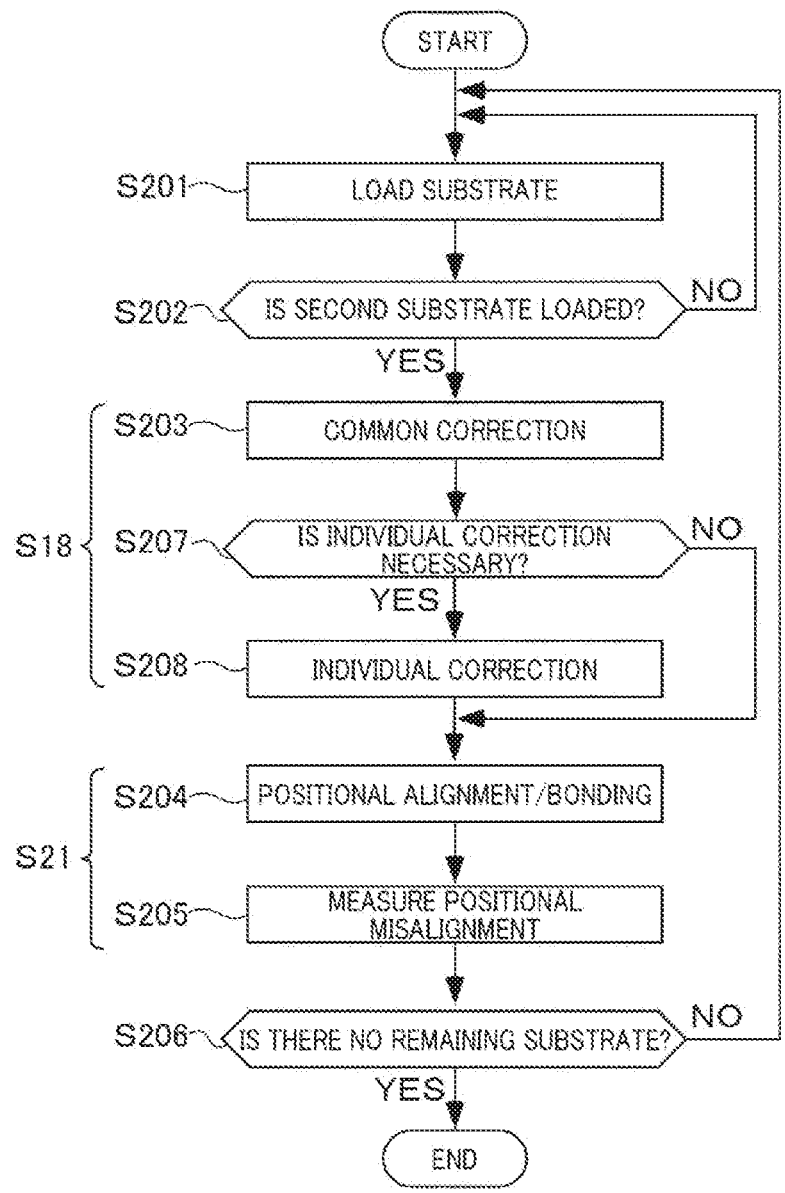
FIG. 6 is a flowchart showing an operation sequence of a stacking unit 13.

FIG. 6 is a flowchart showing a stacking sequence of substrates in the stacking unit 13 of the manufacturing device 10, and is an example of the stacking sequence including step S18 and step S21 in FIG. 2. In the stacking unit 13, first, the substrate processed in the processing unit 11 is loaded (step S201). Herein, the control device 130 checks whether the loaded substrate is a second substrate (step S202). When the loaded substrate is not a second substrate (step S202: NO), the control returns to step S201 and one substrate is additionally loaded.

When it is checked in step S202 that the loaded substrate is a second substrate (step S202: YES), the control device 130 executes common correction for at least one substrate when stacking the two loaded substrates (step S203). The correction conditions that are set in step S203 are the common correction in the stacking unit 13 decided in step S16 of FIG. 2, and may include the information about both the correction method and the correction amount of the substrate.

Also, the individual correction control unit 132 determines for each of the substrates processed by the processing unit 11 whether it is necessary to perform individual correction for the substrate with reference to the measurement result of the second measuring unit 12 (step S207). Herein, when the distortion generated in each of the substrates is less than the preset threshold value (step S207: NO), the individual correction under control of the individual correction control unit 132 is omitted, and the process proceeds to step S204.

When it is determined in step S207 that it is necessary to perform individual correction for the substrate (step S207: YES), the individual correction control unit 132 individually corrects the substrates (step S208), and proceeds to step S204.

The correction method of the correction conditions that are set includes information about a change method of the pattern that is formed on the substrate, for example, a method of performing reduction and enlargement of the magnification, width reduction or width enlargement in a specific direction, and skew and the like. Also, the correction amount of the correction conditions includes values indicative of degrees of the magnification, the amount of deformation and the like.

In the meantime, the correction conditions that are herein set are decided by measuring positions of the alignment marks on the substrates in the stacking unit 13, for example. Therefore, the correction conditions that are set for the stacking unit 13 include correction conditions for correcting distortion inherent to each of the substrates. Also, the correction conditions that are set for the stacking unit 13 may include correction conditions acquired from an outside through the control device 130.

Then, the control device 130 executes positional alignment and bonding of the substrates to form a stacked substrate, under the set correction conditions (step S204). Also, the control device 130 measures positional misalignment between the substrates of the formed stacked substrate (step S205). The information about the positional misalignment obtained by the measurement is referred to by the processing unit 11 through the control device 130, and is used for setting of the correction conditions in the processing unit 11 (step S101).

The stacked substrate formed in this way is carried out from the stacking unit 13, and the control device 130 checks whether there remains a substrate that belongs to the same lot and is not stacked yet, for example (step S206). When there remains a substrate that is not stacked yet (step S206: NO), the control device 130 repeats sequences from step S201 to step S206. When it is checked in step S206 that there remains no substrate that is not stacked yet (step S206: YES), the control device 130 ends the control on the stacking unit 13.

By the above sequences, the correction amount of the correction that is executed by the individual correction control unit 132 is reduced by the correction amount of the correction that has been executed by the common correction control unit 131. In the meantime, the common correction in step S203 and the individual correction in step S208 may be executed at the same time.

Figure 7:
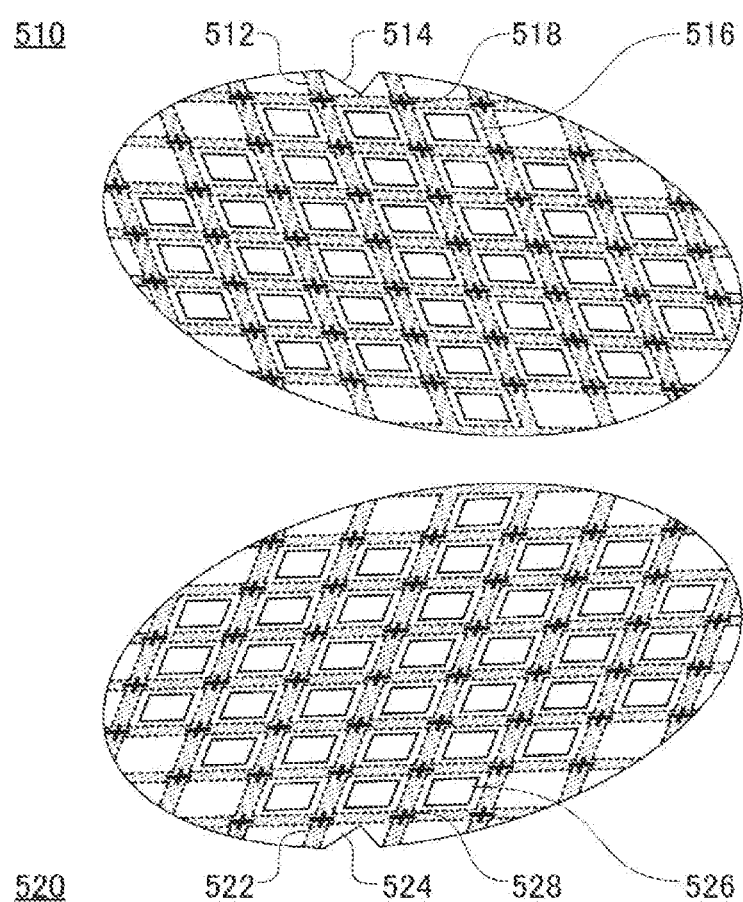
FIG. 7 is a schematic view of substrates 510 and 520.

FIG. 7 is a schematic view of the substrates 510 and 520 processed in the processing unit 11. Each of the substrates 510 and 520 has a notch 514; 524, a plurality of circuit regions 516; 526, and a plurality of alignment marks 518; 528.

The circuit regions 516; 526 are periodically arranged in a plane direction of the substrate 510; 520 on the surface of the substrate 510; 520. In each of the circuit regions 516 and 526, a structure such as wiring, an element, a protection film and the like is provided. Also, in the circuit regions 516 and 526, connection parts such as a pad, a bump and the like that become an electrical connection terminal when stacking one substrate 510 on the other substrate 520 are arranged. The connection parts are also structures formed on the surface of the substrate 510; 520.

The alignment marks 518; 528 are also an example of the structures formed on the surface of the substrate 510; 520, and are arranged in preset relative positions with respect to the connection parts in the circuit regions 516; 526. Thereby, the positions of the circuit regions 516 and 526 can be aligned with each other by using the alignment marks 518 and 528 as an index.

On the substrate 510; 520, scribe lines 512; 522 exist between the plurality of circuit regions 516; 526. The scribe lines 512 and 522 are not structures, and are imaginary cutting lines that are used when dicing the stacked substrate into stacked semiconductor devices. Also, the scribe lines 512 and 522 are cutting margins for the dicing, and are regions that are to disappear from the stacked substrate. Therefore, the alignment marks 518 and 528 that are used when stacking the substrates 510 and 520 and are not necessary after completing the stacked semiconductor devices may also be arranged on the scribe lines 512 and 522.

A stacked substrate formed by stacking the substrates 510 and 520 and another substrate is individually separated into stacked semiconductor devices by cutting the same along the scribe lines. A stacked substrate may be formed by additionally stacking a stacked substrate already formed by stacking the substrates 510 and 520 on another substrate.

Figure 8:
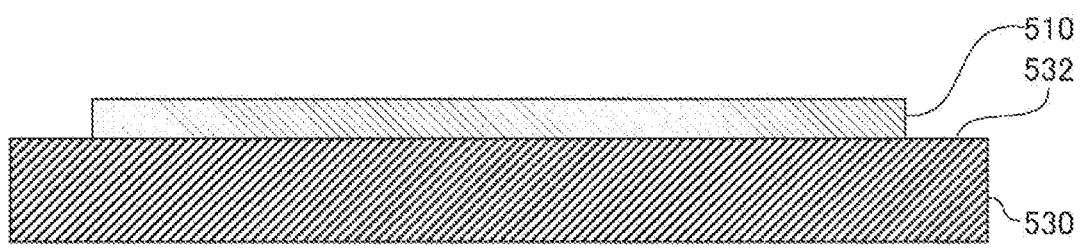
FIG. 8 is a schematic view of a substrate holder 530 that holds the substrate 510.

FIG. 8 is a schematic sectional view of a substrate holder 530 that holds the substrate 510 and is conveyed together with the substrate 510 when handling the substrate 510 in the stacking unit 13. The substrate holder 530 has a thickness and a diameter greater than the substrate 510, and has a flat suction surface 532. The suction surface 532 sucks the substrate 510, integrates the substrate 510 and the substrate holder 530, and holds the substrate 510 in a flat state by an electrostatic chuck, a vacuum chuck or the like.

Figure 9:
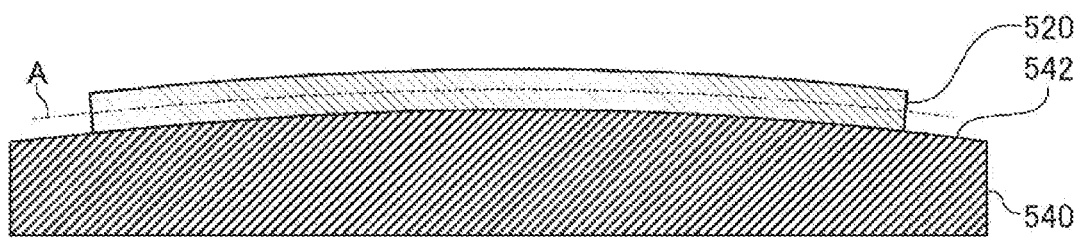
FIG. 9 is a schematic view of a substrate holder 540 that holds the substrate 520.

FIG. 9 is a schematic sectional view of a substrate holder 540 that holds the substrate 520 and is conveyed together with the substrate 520 when handling the substrate 520 in the stacking unit 13. The substrate holder 540 has a thickness and a diameter greater than the substrate 520. A suction surface 542 sucks the substrate 520, and integrates the substrate 520 and the substrate holder 540 by an electrostatic chuck, a vacuum chuck or the like.

Also, the suction surface 542 of the substrate holder 540 that sucks the substrate 520 has a convex shape of which a center is convex. The substrate 520 held on the substrate holder 540 is also in a state in which it protrudes at a center. For this reason, in FIG. 9, on an upper side of a broken line A, the surface of the substrate 520 is expanded and the magnification increases. Also, in FIG. 9, on a lower side of the broken line A, the surface of the substrate 520 is reduced, and the magnification is relatively reduced.

Therefore, when bonding the substrate 520 to another substrate, the increase in magnification of the bonding surface due to the substrate holder 540 may become a target of correction. Also, the increase in magnification of the bonding surface due to the substrate holder 540 may be used as a correction method of the substrate 520. In this case, a plurality of substrate holders 540 of which curvatures of the suction surfaces 542 are different may be prepared, and may be used when individually adjusting the magnification of the bonding surface of the substrate 520. Also, the substrate holder 540 having a constant curvature may be used as a device that executes the common correction under control of the common correction control unit 131.

Also, in the above example, the suction surface 542 of the substrate holder 540 has a convex shape of which a center is convex. However, a substrate holder 540 of which a central part is recessed with respect to a peripheral edge part of the suction surface 542 may be prepared to hold the substrate 520, thereby reducing the magnification of the surface of the substrate 520.

Figure 10:
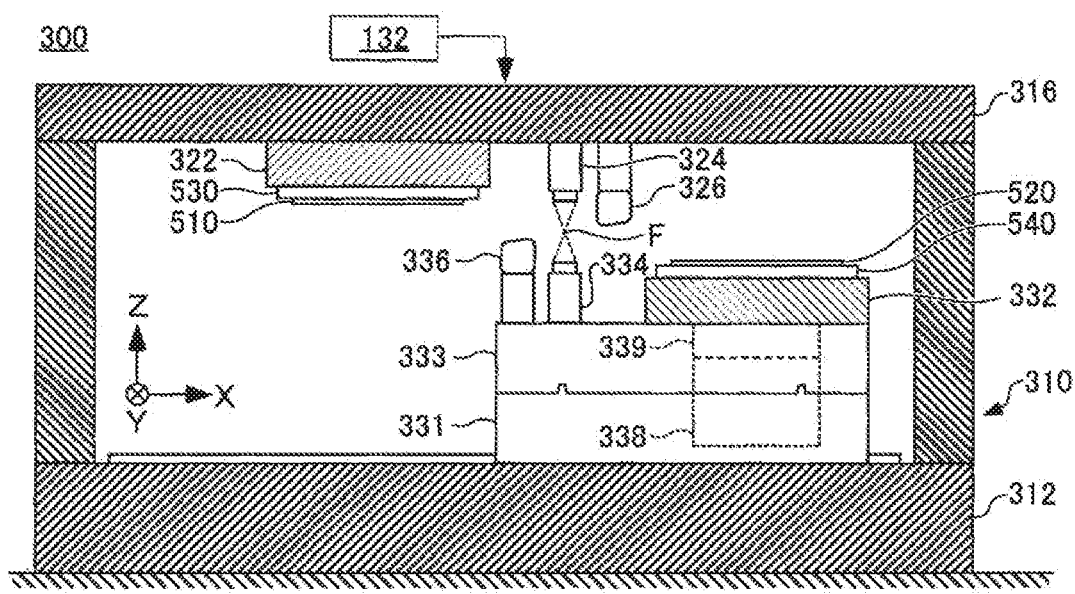
FIG. 10 is a schematic sectional view of a bonding device 300.

FIG. 10 is a schematic view of the bonding device 300. The bonding device 300 includes a frame body 310, an upper stage 322 and a lower stage 332.

The frame body 310 has a bottom plate 312 and a top plate 316 each of which is horizontal. The top plate 316 of the frame body 310 supports the upper stage 322 that is fixed downwardly. The upper stage 322 has a vacuum chuck, an electrostatic chuck and the like, and sucks and holds the substrate holder 530 carried in with the substrate 510 being held thereon.

Also, a microscope 324 and an activation device 326 are fixed to the top plate 316 at a side of the upper stage 322. The microscope 324 observes an upper surface of the substrate 520 mounted on the lower stage 332. The activation device 326 generates plasma to activate an upper surface of the substrate 520 held on the lower stage 332.

On the bottom plate 312, an X-direction drive unit 331, a Y-direction drive unit 333, an elevation drive unit 338, and a rotation drive unit 339 sequentially stacked are arranged. The X-direction drive unit 331 moves in parallel to the bottom plate 312, as shown with an arrow X in FIG. 10.

The Y-direction drive unit 333 moves in a direction parallel to the bottom plate 312 and different from the X-direction drive unit 331 on the X-direction drive unit 331, as shown with an arrow Y in FIG. 10. The operations of the X-direction drive unit 331 and the Y-direction drive unit 333 are combined, so that the lower stage 332 moves two-dimensionally in parallel to the bottom plate 312.

The elevation drive unit 338 displaces the rotation drive unit 339 perpendicularly to the bottom plate 312, as shown with an arrow Z in FIG. 10. Also, the rotation drive unit 339 rotates the lower stage 332 around an axis perpendicular to the bottom plate 312. An amount of movement of the lower stage 332 by the respective operations of the X-direction drive unit 331, the Y-direction drive unit 333, the elevation drive unit 338, and the rotation drive unit 339 are measured with high accuracy by using am interferometer or the like (not shown).

The Y-direction drive unit 333 supports a microscope 334 and ab activation device 336 positioned at a side of the lower stage 332, together with the elevation drive unit 338, the rotation drive unit 339, and the lower stage 332. The microscope 334 and the activation device 336 moves together with the lower stage 332 in a direction parallel to the bottom plate 312, in accordance with the operations of the X-direction drive unit 331 and the Y-direction drive unit 333. In the meantime, a swing drive unit that swings the lower stage 332 around an axis of rotation parallel to the bottom plate 312 may be further provided between the lower stage 332 and the rotation drive unit 339.

Thereby, the microscope 334 observes a lower surface of the substrate 510 held on the upper stage 322. The activation device 336 generates plasma to activate the lower surface of the substrate 510 held on the upper stage 322.

In the meantime, in the state shown in FIG. 10, the substrate holder 530 having the flat suction surface 532 holding the substrate 510 is held on the upper stage 322. Also, the substrate holder 540 having the convex suction surface 542 holding the substrate 520 is held on the lower stage 332. Also, the microscopes 324 and 334 are focused on each other, so that the control device 130 corrects relative positions of the microscopes 324 and 334.

Figure 11:
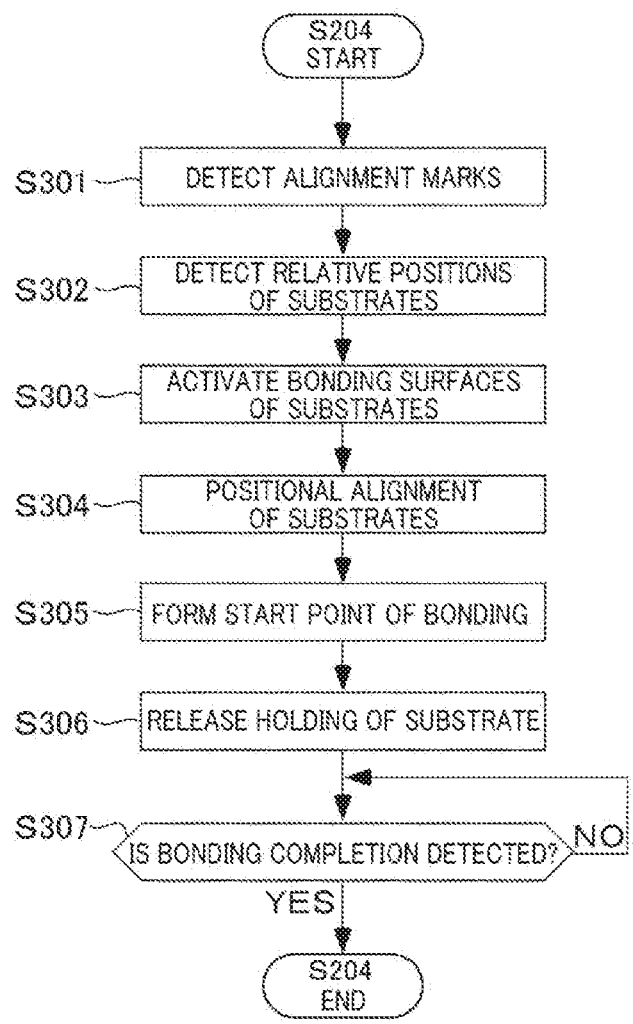
FIG. 11 is a flowchart showing an operation sequence of the bonding device 300.

FIG. 11 is a flowchart showing a sequence of stacking operations in the bonding device 300. The control device 130 first detects positions of the plurality of alignment marks 518, 528 of each of a pair of the substrates 510 and 520 carried into the bonding device 300 by using the microscopes 324 and 334 (step S301).

Figure 12:
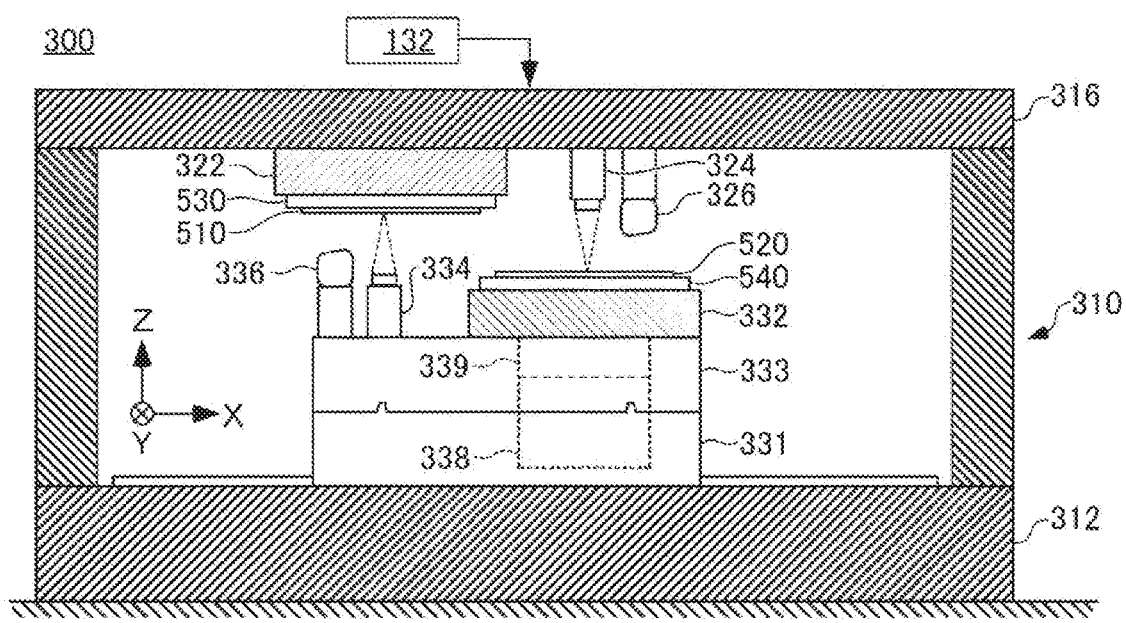
FIG. 12 illustrates an operation of the bonding device 300.

FIG. 12 is a schematic sectional view depicting a state of the bonding device 300 in step S301. As shown, the control device 130 operates the X-direction drive unit 331 and the Y-direction drive unit 333, thereby moving the lower stage 332 and the microscope 334.

Thereby, the microscope 324 is in a state in which it can observe the alignment marks 528 on the substrate 520. Based on an amount of movement of the lower stage 332 until the alignment marks 528 to be observed reach preset positions in a field of view of the microscope 324, the control device 130 can accurately detect positions of the alignment marks 528. Likewise, the alignment marks 518 of the substrate 510 held on the upper stage 322 are observed by the microscope 334, so that the control device 130 can accurately detect positions of the alignment marks 518 on the substrate 510.

In the meantime, the microscopes 324 and 334 as described above can observe the alignment marks 518 and 528 through the substrates 510 and 520 even after the substrates 510 and 520 are stacked to form a stacked substrate. Therefore, the microscopes 324 and 334 may be used as the first measuring unit 14 of the manufacturing device 10. In this case, after stacking the substrates 510 and 520 by the bonding device 300, the positional misalignment in the stacked substrate can be measured in the bonding device 300, as it is.

Then, the control device 130 calculates relative positions of the substrates 510 and 520, based on the positions of the alignment marks 518 and 528 detected in step S301 (step S302). That is, the positions of the alignment marks 518 and 528 of the substrates 510 and 520 are detected by the microscopes 324 and 334 of which original relative positions are already known, so that the control device 130 calculates the relative positions of the substrates 510 and 520.

Thereby, when the positional alignment of the substrates 510 and 520 are executed, an amount of relative movement of the substrates 510 and 520 may be calculated so that the positional misalignment between the corresponding alignment marks 518 and 528 on the substrates 510 and 520 is equal to or less than a threshold value or the positional misalignment between the corresponding circuit regions 516 and 528 or connection parts on the substrates 510 and 520 is equal to or less than the threshold value.

Figure 13:
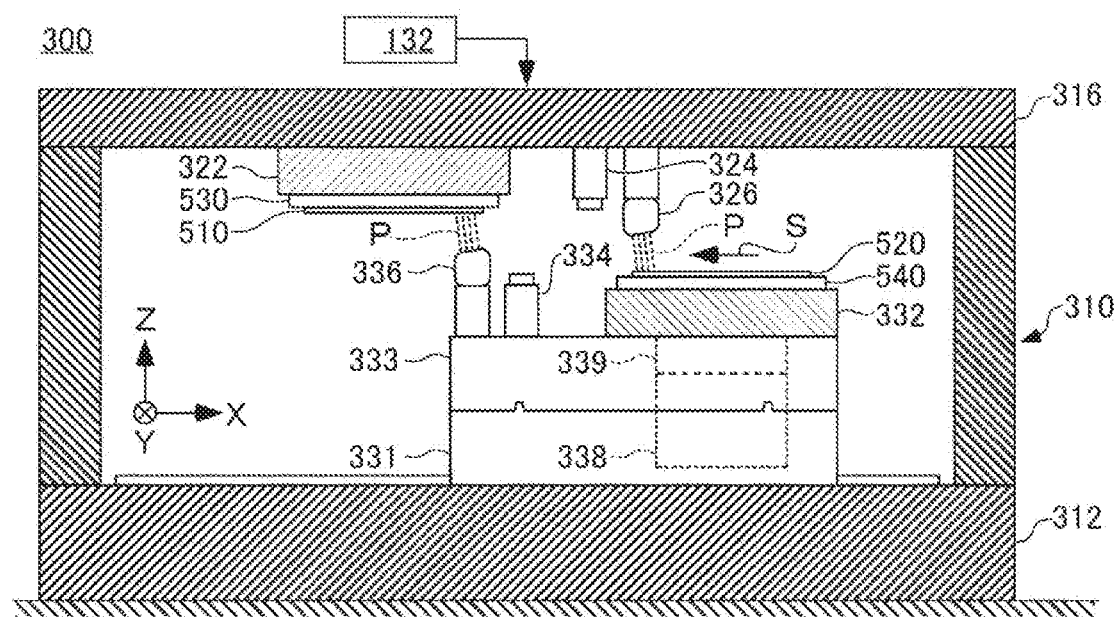
FIG. 13 illustrates an operation of the bonding device 300.

Then, the control device 130 causes the activation devices 326 and 336 to scan the surfaces of the substrates 510 and 520 (step S303). FIG. 13 is a schematic sectional view depicting a state of the bonding device 300 in step S303. As shown, while operating the activation devices 326 and 336 to generate the plasma, the control device 130 moves the lower stage 332 and exposes the respective surfaces of the substrates 510 and 520 to the plasma. Thereby, the bonding surfaces of the substrates 510 and 520 are highly cleaned, and chemical activities thereof are increased.

The bonding surfaces may also be activated by activating the surfaces of the substrates 510 and 520 by sputter etching using inert gases, an ion beam, a high-speed atomic beam or the like, in addition to the exposing method to the plasma. When using the ion beam or high-speed atomic beam, the bonding device 300 is entirely subjected to a reduced pressure environment. Also, the substrates 510 and 520 may be activated by ultraviolet irradiation, ozone asher or the like. Also, for example, the substrates 510 and 520 may be activated by chemically cleaning the surfaces of the substrates 510 and 520 with a liquid or gaseous etchant. After activating the surfaces of the substrates 510 and 520, the surfaces of the substrates 510 and 520 may be hydrophilized by a hydrophilizing device.

In the meantime, in the present embodiment, the activation devices 326 and 336 are provided in the bonding device 300 but may be arranged at different places from the bonding device 300 and the activated substrates 510 and 520 may be carried into the bonding device 300. Also, when the bonding surface of one of the substrates 510 and 520 is activated, the substrates 510 and 520 may be bonded even though the other is not activated.

Figure 14:
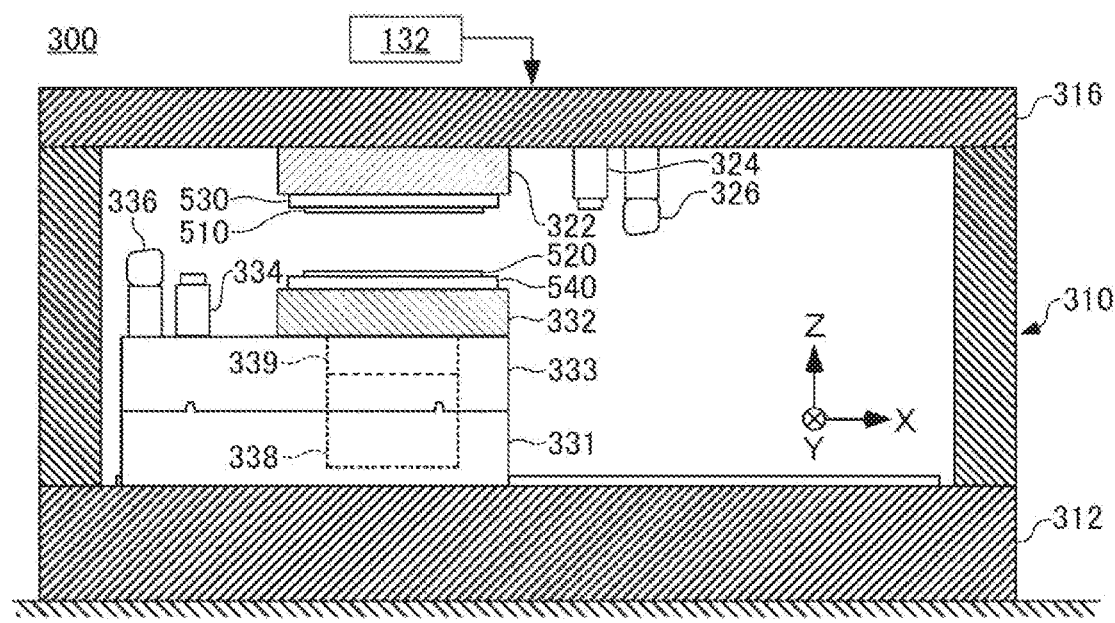
FIG. 14 illustrates an operation of the bonding device 300.

Then, the control device 130 executes the positional alignment of the substrates 510 and 520 (step S304). FIG. 14 is a schematic sectional view depicting a state of the bonding device 300 in step S304. As shown, the positional alignment of the substrates 510 and 520 are executed by moving the lower stage 332 in an amount of movement based on the relative positions of the substrates 510 and 520 detected in step S301 and setting the amount of positional misalignment between the alignment marks 518 and 528 on the substrates 510 and 520 to the threshold value or less. In the meantime, a positional misalignment component that could not be eliminated by the movement (X-Y) and rotation (θ) of the lower stage 332 in this step becomes a correction target.

Figure 15:
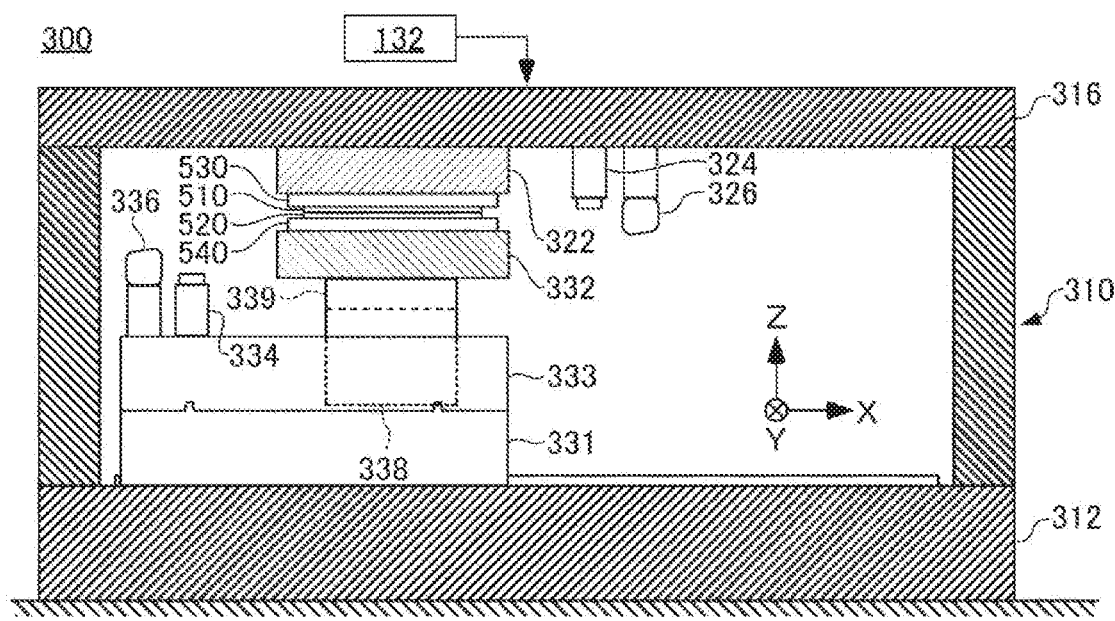
FIG. 15 illustrates an operation of the bonding device 300.

When the positions of the substrates 510 and 520 are aligned with each other, the control device 130 brings the substrates 510 and 520 into partial contact with each other to form a starting point of the bonding (step S305). FIG. 15 is a schematic sectional view depicting a state of the bonding device 300 in step S305. As shown, the control device 130 operates the elevation drive unit 338 to bring the substrates 510 and 520 into partial contact with each other, so that a starting point of the bonding is formed.

Figure 16:
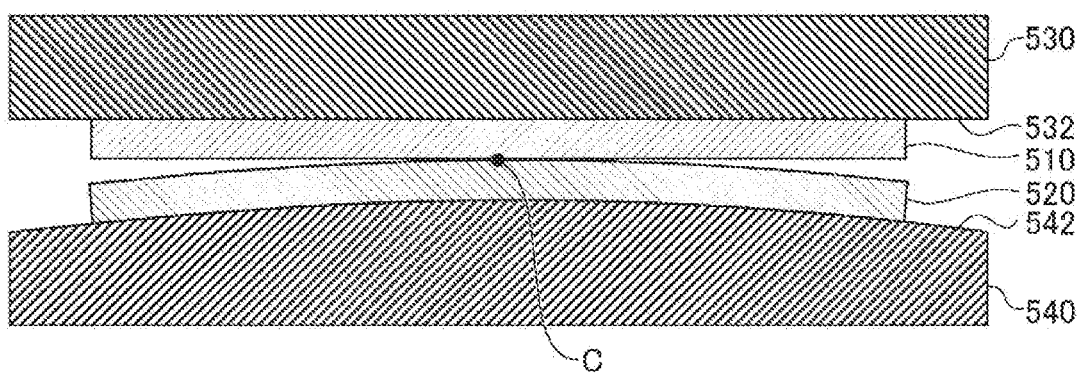
FIG. 16 is a schematic view illustrating a stacking process.

FIG. 16 schematically shows formation of a starting point C on the substrates 510 and 520 to be bonded. As described above with reference to FIG. 9, when the substrate 520 of which a center protrudes due to the shape of the substrate holder 540 is brought close to and into contact with the flat substrate 510 held on the flat substrate holder 530, the substrates 510 and 520 first come into contact with each other at a part near the center, so that the starting point C is formed.

Thereafter, when the suction of the substrate 510 by one of the substrate holders 530 and 540, for example, the substrate holder 530 is released, a region in which the substrates 510 and 520 are contacted to each other expands from the part of the center wherein the substrates first come into contact with each other toward an outer periphery and the substrates 510 and 520 eventually come into contact with each other as a whole. In this way, the substrates 510 and 520 are first brought into partial contact with each other and the contact region is then expanded toward the outer periphery, so that air bubbles and the like are prevented from being left between the substrates 510 and 520 while stacking the substrates 510 and 520.

As described above, since the surfaces of the substrates 510 and 520 are activated, the substrates 510 and 520 are bonded in the contact region by an intermolecular force. In this way, the starting point of the bonding is formed at the parts of the substrates 510 and 520.

Subsequently, the control device 130 releases the holding state of one of the substrates 510 and 520, for example, the substrate 510 held on the upper stage 322 by the substrate holder 530 (step S306). Thereby, a bonding wave that the bonding region of the substrates 510 and 520 sequentially expands toward edges of the substrates 510 and 520 occurs, so that the substrates 510 and 520 are eventually bonded as a whole.

The control device 130 releases the holding state of the substrate 510 in step S306, and then monitors the expanding of the bonding region. Thereby, for example, when the bonding region being expanded reaches the edges of the substrates 510 and 520, the control device detects that the bonding between the substrates 510 and 520 is completed (step S307: YES). In other words, the control device 130 fixes the lower stage 332 and continues to expand the bonding region until the bonding between the substrates 510 and 520 is completed (step S307: NO).

In the meantime, while the contact region of the substrates 510 and 520 is expanded, as described above, the control device 130 may partially or stepwise release the holding state of the substrate 510 by the substrate holder 530. Also, the control device may progress the bonding between the substrates 510 and 520 by releasing the substrate 520 on the lower stage 332 without releasing the substrate 510 on the upper stage 322.

Also, both the two substrates 510 and 520 may be released. Also, while holding the substrates 510 and 520 on both the upper stage 322 and the lower stage 332, the upper stage 322 and the lower stage 332 may be brought closer to each other to bond the substrates 510 and 520.

In the process of bonding the substrates 510 and 520 accompanied by the generation of the bonding wave, new positional misalignment may be caused. The generation process of the positional misalignment is described with reference to FIGS. 17 to 20.

Figure 17:
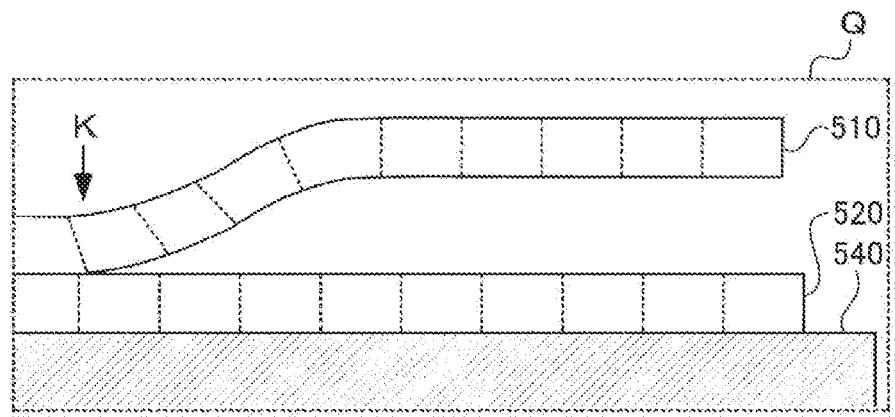
FIG. 17 is a schematic view illustrating a positional misalignment component that is generated in the stacking processing.

FIG. 17 is an enlarged view of a region Q in the vicinity of a boundary K between a contact region in which the substrates 510 and 520 have already contacted and a non-contact region in which the substrates 510 and 520 have not contacted yet and will come into contact with each other from now in the bonding process in the bonding device 300. As shown, while the contact region of the two superimposed substrates 510 and 520 is expanded from the center toward the outer peripheries, the boundary K moves from the center side of the substrates 510 and 520 toward the outer peripheries. In the vicinity of the boundary K, the extension is caused in the substrate 510 released from the holding state by the substrate holder 530. Specifically, at the boundary K, the substrate 510 is extended on a lower surface side of the substrate 510 in FIG. 17 with respect to a central plane of the substrate 510 in a thickness direction, and the substrate 510 is contracted on an upper surface side of FIG. 17.

Thereby, as shown with the dotted line in FIG. 17, an outer end of the region of the substrate 510 bonded to the substrate 520 is distorted as if the magnification for the design specification of the circuit region 516 on the substrate 510 is enlarged with respect to the substrate 520. For this reason, as shown with the misalignment of the dotted line in FIG. 17, positional misalignment due to a difference in an amount of extension of the substrate 510, i.e., a difference in the magnification is caused between the lower substrate 520 held on the substrate holder 540 and the upper substrate 510 released from the substrate holder 530.

Figure 18:
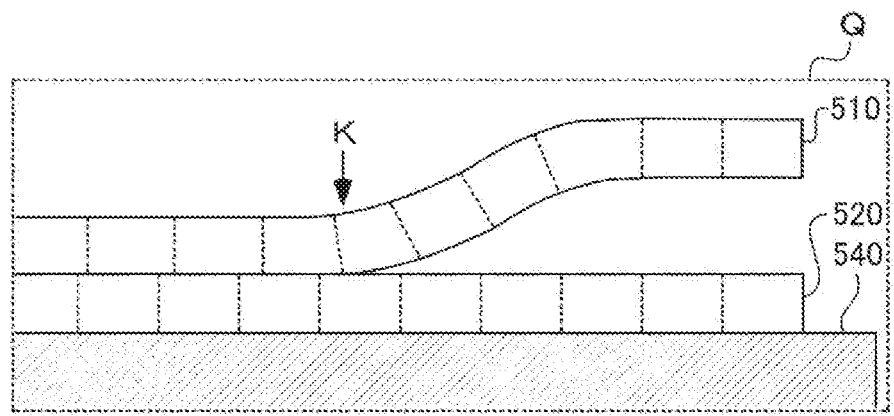
FIG. 18 is a schematic view illustrating the positional misalignment component that is generated in the stacking processing.
Figure 19:
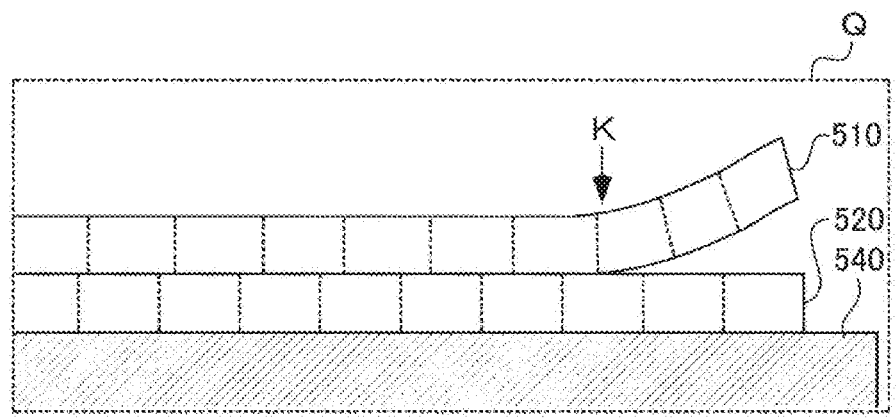
FIG. 19 is a schematic view illustrating the positional misalignment component that is generated in the stacking processing.

As shown in FIG. 18, if the substrates 510 and 520 are contacted and bonded in a state in which the amounts of deformation are different, the enlarged magnification of the substrate 510 is fixed. Also, as shown in FIG. 19, the amount of extension of the substrate 510 that is fixed by the bonding cumulatively increases as the boundary K moves toward the outer peripheries of the substrates 510 and 520.

Figure 20:
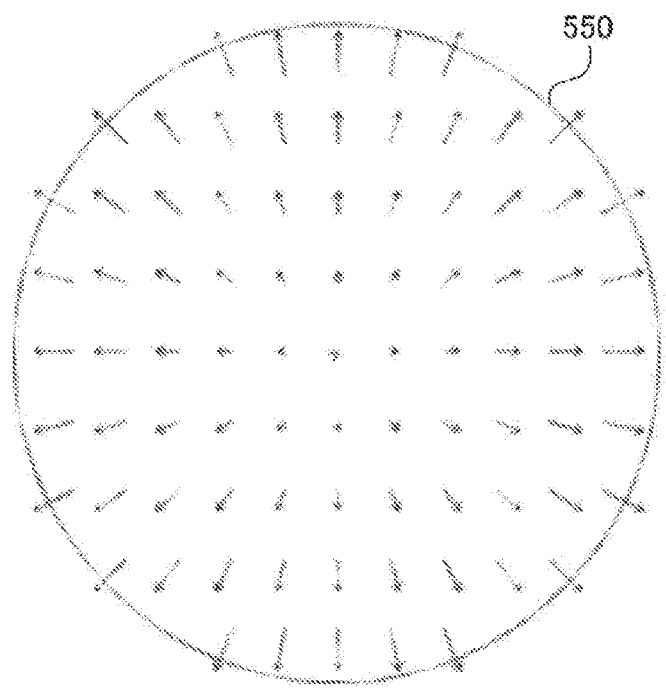
FIG. 20 is a schematic view showing a distribution of positional misalignments.

FIG. 20 shows a distribution of positional misalignment components due to the magnification difference between the two substrates 510 and 520 configuring a stacked substrate 550. The shown misalignment has an amount of misalignment that gradually increases radially from a central point of the stacked substrate 550 in a plane direction. Therefore, on the whole of the substrates 510 and 520, the magnification becomes different, which is actualized.

A magnitude of the positional misalignment that is caused during the bonding can be predicted based on physical quantities such as stiffness of the substrates 510 and 520 to be bonded, viscosity of the atmosphere between the substrates 510 and 520, and the like. Also, the positional misalignment that is generated due to the above cause steadily appears in the bonding of the plurality of stacked substrates 550 if the specifications of the substrates 510 and 520 to be bonded, the bonding conditions by the bonding device 300 and the like are constant. Therefore, when bonding the plurality of stacked substrates 550, it is possible to effectively correct all the stacked substrates 550 with the common correction conditions that are indicated by the common correction control unit 131.

Also, for example, even when there is a difference in magnification between the substrates 510 and 520 due to an error of an optical system in the patterning using the circuit forming device 200, the positional misalignment components as shown in FIG. 20 are generated. In other words, when the positional misalignment due to the difference in magnification in the stacked substrate 550 is steadily observed by the first measuring unit 14, the circuit forming device 200 optically changes a magnification of a pattern that is formed by the exposure device, for example, under control by the correction conditions indicated from the common correction control unit 131. Thereby, it is possible to correct the plurality of stacked substrates 550 by a common correction amount.

Also, in the exposure device, the exposure may be repeated in multiple times so as to form one layer. In this case, by adjusting an interval between shots for exposure on the wafer or an interval between chips, the structures can be arranged so as to cancel the initial magnification and the distortion of the substrate that is generated during the bonding. Also, the exposure condition is set so that, when the positions of the structures are displaced due to the distortion that is generated in the substrate 510, which is released from the holding state by the substrate holder upon the bonding, during the bonding, the structures are formed in positions, which correspond to positions of the displaced structures on the substrate 510, of the substrate 520 that is not released from the holding state by the substrate holder upon the bonding. Thereby, the amount of positional misalignment due to the difference in distortion between the wafers can be reduced below a predetermined threshold value. When the exposure device is used as the circuit forming device 200, the magnification component, the orthogonal component and the non-linear component of the distortion can be individually corrected. Like this, the correction by the exposure device includes adjusting an exposure position to at least one substrate so that the amount of positional misalignment caused when the two substrates 510 and 520 are bonded is equal to or smaller than the threshold value.

In the meantime, the amount of deformation of the substrate 510 that is a cause of the positional misalignment described with reference to FIGS. 17 to 20 depends on the stiffness of the substrate 510. For this reason, when a stiffness distribution is generated in the substrate 510 due to crystal anisotropy of the wafer, and the like, the crystal anisotropy is also reflected in the change in magnification shown in FIG. 20. For this reason, the correction cannot be performed by the simple magnification correction. Also, when bonding a substrate for which a wafer having crystal anisotropy is used, it may be necessary to perform positional alignment upon the bonding even for a bare wafer having no structure, so as to reduce an influence of the stiffness distribution.

Also, as described above with reference to FIGS. 17 to 20, one of the substrates 510 and 520 to be bonded, i.e., the upper substrate 510 in the above example is released from the holding state by the substrate holder 530 during the bonding. Therefore, when correcting the magnification of the substrate 520 by the shape of the suction surface 542 of the substrate holder 540, the correction is executed for the substrate that is not released from the holding state.

In the above-described series of processes of manufacturing the stacked substrate 550, the positional misalignment that is generated in the stacked substrate 550 includes a component due to the initial distortion of each of the substrates 510 and 520 and a component due to the distortion that is generated during the bonding. Here, the initial distortions that are generated in the individual substrates 510 and 520 can be individually detected using the microscopes 324 and 334 in the bonding device 300. Therefore, it is possible to calculate the distortion components that are generated during the bonding by excluding the initial distortions of the respective substrates 510 and 520 from the positional misalignment measured from the stacked substrate 550 by the first measuring unit 14.

For each of the distortion components calculated in this way, the decision unit 133 assigns the distortion that commonly appears in the plurality of substrates to the common correction control unit 131, so that it is possible to reduce a load of the correction that is executed under control of the individual correction control unit 132. The correction that is executed by the individual correction control unit 132 is executed in the stacking unit 13, for example. Therefore, the load of the individual correction control unit 132 is reduced, so that the processing in the stacking unit 13 can be speeded up.

Therefore, the decision unit 133 may calculate a distortion variation between the individual substrates 510 and 520, as 3σ (σ: standard deviation), for each of the distortion component that is generated during the bonding and the initial distortion component of each of the substrates 510 and 520, for example. Thereby, since it is possible to evaluate a degree of reproducibility of the distortion, the decision unit 133 can decide an item that is assigned to the common correction control unit 131 and is commonly corrected in manufacturing the plurality of stacked substrates 550 by using the preset threshold value.

For example, the positional misalignment component due to the difference in magnification of the substrate includes a component that commonly appears in the substrates 510 and 520 of the same lot processed in the same processing unit 11 or in the stacked substrate 550 of the same lot stacked using the same stacking unit 13, in many cases. Therefore, it is possible to efficiently correct the common component of the distortion that is actualized as the positional misalignment, under control of the common correction control unit 131.

That is, the correction that is commonly executed for the plurality of substrates by the common correction control unit 131 is executed by the correction amount that is decided by the decision unit 133 based on the positional misalignment measured for some of the stacked substrates 550 manufactured at the early stage among the plurality of stacked substrates 550 to be manufactured. Therefore, in the common correction that is executed by the common correction control unit 131, the measurement for the individual substrates 510 and 520 or the stacked substrate 550 can be omitted, so that it is possible to reduce the man-hour relating to the execution of the correction. Also, since the individual correction control unit 132 only needs to correct a difference between the correction that is executed by the common correction control unit 131 and the individual distortion of the substrates 510 and 520, it is possible to reduce the load relating to the correction that is executed by the individual correction control unit 132.

In the meantime, the decision of the correction amount that is provided to the common correction control unit 131 by the decision unit 133 is not limited to one time. Even after the decision unit 133 once decides the correction amount, the common correction control unit 131 may continue the measurement and the decision unit 133 may periodically update the correction amount. Thereby, it is possible to further improve the efficiency of the correction that is executed by the common correction control unit 131. Also, the correction conditions that are indicated by the common correction control unit 131 and the effects thereof are accumulated in the control device 130, so that it is possible to improve the accuracy of the correction to be performed by the common correction control unit 131 as the operation of the manufacturing device 10 increases.

Also, the positional misalignment that is generated in the stacked substrate 550 is not limited to one caused due to the difference in magnification, and includes positional misalignment components due to many causes such as quality, crystal anisotropy and initial distortion of wafers becoming the substrates 510 and 520, heat hysteresis and pressure hysteresis when processing the substrates 510 and 520, shapes of the substrate holders 530 and 540 that are used in the stacking unit 13, and habits of the bonding device 300 and the thinning device 400 in the stacking unit 13.

Therefore, the decision unit 133 may decide a device that executes correction by an indication of the common correction control unit 131 and a correction amount with reference to not only the measuring unit of the first measuring unit 14 but also manufacturing conditions in the processing unit 11, bonding conditions in the stacking unit 13, and the like. Also, the decision unit 133 may acquire information about distortions of the substrates 510 and 520 from an external database and the like, and decide the correction amount, considering the information.

Also, when the plurality of processing units 11 or the plurality of stacking units 13 is provided in the manufacturing device 10 and the manufacturing devices 10 is thus operated in multiple times, the accuracy and efficiency of the decision can be improved by mutually referring to the measurement results of the first measuring unit 14 and the second measuring unit 12 or accumulating the measurement results in a common database. In this case, for example, even though the processing unit 11, the stacking unit 13, the control device 130 and the like configuring the manufacturing device 10 or a plurality of manufacturing devices 10 are not operated at the same place, when the information can be shared via a communication line, the decision units 133 of the plurality of manufacturing devices 10 can share the information each other, thereby improving the decision accuracy.

Also, when the information about the distortion components of the substrates 510 and 520 that are detected in the stacking unit 13 with respect to the positional alignment of the substrates is fed back to the processing unit 11, the individual tendency and the like of the film depositing device 100 and the circuit forming device 200 can also be corrected. Also, when the information about the distortion and the like that are generated in the individual processing unit 11 is accumulated in the common database, the decision unit 133 can decide the correction conditions in which the tendency of the processing unit 11 is reflected, in addition to the measurement results from the first measuring unit 14, the second measuring unit 12 and the like.

Also, when the plurality of manufacturing devices 10 is provided or when the plurality of processing units 11 or the plurality of stacking units 13 is provided in the manufacturing device 10, the decision unit 133 may decide the correction amount for a distortion component that is commonly generated in the plurality of devices. In this case, it is sufficient to provide one decision unit 133 for a plurality of devices.

In the meantime, when bonding the substrates to manufacture the stacked substrate 550 in the stacking unit 13, the distortion that is corrected so as to reduce the mutual positional misalignment between the substrates 510 and 520 of the stacked substrate 550 includes following three distortions. (A) distortion that is generated during the bonding in the stacking unit 13. (B) distortion that is generated in the substrate 510 by the processing before the bonding. (C) distortion that is generated in the substrate 520 by the processing before the bonding.

Among the distortions (A), (B) and (C), the distortions (B) and (C) in the substrates can be individually detected in the process of the positional alignment in the bonding device 300. Also, a sum of the distortions (A). (B) and (C) can be detected by measuring the positional misalignment of the substrates 510 and 520 of the manufactured stacked substrate 550. Therefore, the distortions (A), (B) and (C) can be individually detected.

When the plurality of stacked substrates 550 is manufactured, the decision unit 133 of the manufacturing device detects a component of the distortions (A), (B) and (C) that steadily appears and decides a correction amount for correcting the component. In order to perform the correction by using the decided correction amount as a common correction amount, at least one of a processing parameter for the substrates 510 and 520 in the processing unit 11 and an initial setting value in the bonding of the substrates 510 and 520 by the stacking unit 13 is set to reduce the correction amount for each individual of the stacked substrate 550 in the bonding device 300.

Herein, when all the correction amounts are assigned to one substrate 510 and the correction is performed in the processing step such as exposure in the exposure device, the mutual positional misalignment between the substrates 510 and 520 of the stacked substrate 550 formed by the stacking is reduced. However, the distortion (C) in the other substrate 520 that is not corrected remains as it is, so that the distortion having a magnitude corresponding to the distortion (C) remains in the substrate 510. For this reason, when the substrate 510-side of the manufactured stacked substrate 550 is thinned to further stack another substrate or when any structure is formed on the surface of the stacked substrate 550, it is necessary to perform correction for generating distortion corresponding to the remaining distortion (C) in another substrate and the structure.

All the correction amounts may be assigned to the other substrate 520, the correction may be performed in the processing step, and another substrate may be stacked on the substrate 510 of the manufactured stacked substrate 550 or any structure may be formed on the surface of the stacked substrate 550. In this case, the distortions (A) and (B) remain in the substrate 510. For this reason, when stacking another substrate on the substrate 510, on condition that distortion of which a difference from a total of the distortions (A) and (B) is equal to or less than the threshold value is generated in another substrate, distortion may be generated without correcting another substrate and the bonding may be performed.

Also, for example, when the distortion (C) in the substrate 520 is sufficiently small, the distortions (A) and (B) may be corrected in the processing step for the substrate 510 of which the distortion (B) is larger and the substrates 510 and 520 may be bonded. In this case, although the distortion (C) is not corrected, the distortion in the entire stacked substrate 550 coincides with the relatively small distortion (C). Therefore, when thinning the stacked substrate 550 manufactured in this way, the substrate 510 corrected in the processing step is preferably thinned.

Also, in the processing step, when the distortion (B) in one substrate 510 and the distortion (C) in the other substrate 520 are respectively corrected, the substrates 510 and 520 are bonded without considering the positional misalignment due to the distortions (B) and (C) of the respective substrates 510 and 520, so that the stacked substrate 550 in which the positional misalignment is small can be manufactured. In this case, the distortion (B) and (C) components generated in the film depositing step and the like after the patterning in the processing step of the substrates 510 and 520 may be individually corrected for each individual in the bonding device 300. Also, the correction of the distortion (A) may be assigned to the correction in the processing step of one of the substrates 510 and 520 or may be performed in the bonding step.

In the meantime, in any case, the variation of the distortion that is generated in each of the substrates 510 and 520, i.e., the variation from the common correction amount may be individually corrected by a correction mechanism of the bonding device 300. Also, the positional misalignment of the substrates 510 and 520 of the manufactured stacked substrate 550 may be measured and reflected in the correction amount in the processing of next substrates 510 and 520 and the manufacturing of the stacked substrate 550.

When a specific distortion component of which the variation is small is detected, a pattern itself of the reticle and the like that is used for the circuit forming device 200 of the processing unit 11 may be modified. Thereby, it is possible to further reduce the load of each unit in the manufacturing device 10.

Also, since the distortion component that is generated during the bonding may depend on the characteristics of the manufacturing device 10, the measurement results by the first measuring unit 14 may be accumulated and referred to when manufacturing other types of the stacked substrate 550. Also, when there is an extremely different value in the measurement results measured for the plurality of stacked substrates 550 by the first measuring unit 14, the decision unit 133 may decide a correction item with excluding the abnormal value.

Also, the decision unit 133 may decide, as the common correction amount of the correction that is executed through the common correction control unit 131, an average value, a median value, a mode value or a minimum value of the amount of positional misalignment measured by the first measuring unit 14. In this case, the decision unit 133 calculates an average value, a median value, a mode value or a minimum value from the different amounts of positional misalignment generated when sets of the plurality of substrates 510 and 520 are bonded to manufacture the plurality of stacked substrates 550, as the correction amount of the correction that is performed in the common correction control unit 131. In the meantime, the correction that is individually performed by the individual correction control unit 132 for each manufacturing of the stacked substrate 550 is a difference between the correction amount of the correction that is commonly executed by the common correction control unit 131 and the amount of positional misalignment in each of the stacked substrates 550.

For example, when the correction amount is an average value, a value obtained by subtracting the average value from the amount of positional misalignment that is predicted to be generated between the substrates 510 and 530 when bonding the two substrates 510 and 530 is set as the correction amount of the correction that is performed by the individual correction control unit 132. Since a difference with respect to the average value is different for each set of the substrates 510 and 530 to be bonded and there is a variation with respect to the average value, the correction amount of the correction that is performed by the individual correction control unit 132 is different for each of the substrates 510 and 530. The same applies to a case in which the correction amount is a median value, a mode value or a minimum value.

Also, for a plurality of types of positional misalignment components obtained by measuring the positional misalignment of the substrates 510 and 520 of the plurality of stacked substrates 550, the variation among the individuals is calculated as 3σ, for example, and it is possible to evaluate that the positional misalignment component is a common component to the plurality of stacked substrates 550, depending on whether the value is smaller than a preset threshold value. Herein, the component that is determined common is decided as a component that is commonly corrected by the common correction control unit 131.

In this case, the threshold value may be decided, depending on whether a magnitude of the positional misalignment that can be generated in the stacked substrate 550 achieves preset target accuracy, for example. In this way, the positional misalignment component determined as being commonly correctable for the plurality of stacked substrates 550 can be corrected in accordance with one correction condition, in the step of processing the substrates 510 and 520 in the processing unit 11, for example.

In the meantime, when calculating the correction amount, the positional misalignment in each of the plurality of stacked substrates 550 may be decomposed into a magnification component and a non-linear distortion component. In this case, an average value, a median value, a mode value or a minimum value of magnification components in the plurality of stacked substrates 550 may be set as the common correction amount, and a difference between a magnification, which is generated as a result of bonding of the substrate corrected using the common correction amount and another substrate, and the common correction amount may be set as the individual correction amount. In the meantime, regarding the non-linear component, non-linear components may be obtained in a plurality of common positions to the plurality of stacked substrates 550, an average value, a median value, a mode value or a minimum value of the non-linear distortion components in the respective positions may be set as the common correction amount in each of the positions, and a difference between non-linear distortion, which is generated as a result of bonding of the substrate corrected using the common correction amount and another substrate, and the common correction amount may be set as the individual correction amount.

As described above with reference to FIG. 6, in the bonding device 300 of the stacking unit 13, the alignment marks 518; 528 are detected for each of the substrates 510 and 520, and the deformation or distortion of the substrates 510 and 520 is detected. Therefore, in the stacking unit 13, the individual positional misalignment component that is generated in each of the substrates 510 and 520 can be corrected. Therefore, the positional misalignment component that is commonly generated in the plurality of stacked substrates 550 is corrected in the processing step of the processing unit 11, so that the correction conditions of the correction in the stacking unit 13 are specialized into the positional misalignment that is individually generated for each of the substrates 510 and 520. Thereby, it is possible to perform the correction more efficiently.

Also, the positional misalignment component that is generated in the stacking unit 13 and is not generated yet in the processing unit 11 is corrected in advance in the processing unit 11, so that the correction amount that can be eventually corrected in the entire manufacturing device 10 becomes a sum of a range to be correctable in the processing unit 11 and a range to be correctable in the stacking unit 13. Therefore, the correction amount that can be corrected in the entire manufacturing device 10 increases. From this standpoint, the common correction that is executed by the common correction control unit 131 may also be executed in the stacking unit 13.

In the meantime, in the manufacturing device 10, at least a part of the positional misalignment that is generated in the stacking unit 13 may be corrected in the processing unit 11. For this reason, the positional misalignment with respect to a design value of the substrate processed in the processing unit 11 may temporarily increase, as compared to a case in which the correction is performed only for the positional misalignment that is generated in the processing unit 11.

Also, the common correction control unit 131 may share and execute the common correction amount provided by the decision unit 133 with a plurality of devices that performs a plurality of processes in the manufacturing device 10. For example, the initial distortions in the substrates 510 and 520 may be divided into a component that can be predicted in advance, such as an average value, a median value, a mode value, a minimum value and the like, and a fine individual difference that is the variation as a deviation with respect to an average value, a median value, a mode value or a minimum value and cannot be predicted, and the former may be corrected in the circuit forming device 200 and the latter may be corrected in the bonding device 300.

Also, when even a part of the processing for the substrates 510 and 520 has been already completed at the time when the decision unit 133 decides the correction amount, the substrates 510 and 520 cannot be corrected in the processing unit 11. Therefore, in this case, even a distortion component that is suitable for correction in the processing unit 11 may be decided as being corrected in another device such as the stacking unit 13.

Also, an additional correction device such as the substrate holder 540 having the convex suction surface 542, a table device having an actuator to be described later with reference to FIGS. 21 to 23, for example, a mini jack or a mini balloon, and the like may be used together. In this case, the correction in which the common correction amount such as an average value, a median value, a mode value, a minimum value and the like is used is performed for the substrate holder 540, and a difference between a correction amount of the correction and an amount of positional misalignment to be actually corrected is corrected using the correction device. That is, in this case, the selection of the substrate holder 540 is controlled by the common correction control unit 131, and the correction device is controlled by the individual correction control unit 132.

Figure 21:
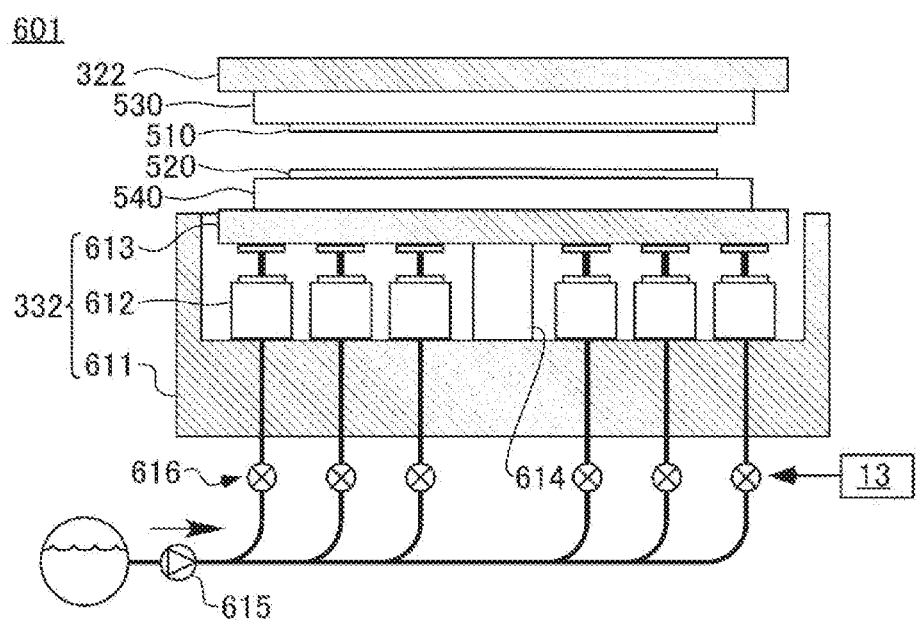
FIG. 21 is a schematic sectional view of a correction device 601.

FIG. 21 is a schematic sectional view of a correction device 601 that can be used when individually correcting the substrate 520 in the stacking unit 13. The correction device 601 is incorporated into the lower stage 332 of the bonding device 300, and corrects one side of the substrate 520 carried into the bonding device 300.

The correction device 601 includes a base unit 611, a plurality of actuators 612, and a suction unit 613. The base unit 611 supports the suction unit 613 via the actuators 612. The suction unit 613 includes a suction mechanism such as a vacuum chuck, an electrostatic chuck and the like, and forms the upper surface of the lower stage 332. The suction unit 613 sucks and holds the carried substrate holder 540.

The plurality of actuators 612 are arranged below the suction unit 613 along a lower surface of the suction unit 613. Also, the plurality of actuators 612 is individually driven under control of the control device 130 as an operating fluid is supplied from an outside via a pump 615 and valves 616. Thereby, the plurality of actuators 612 is individually extended and contracted in different amounts of extension and contraction in a thickness direction of the lower stage 332. i.e., in a superimposition direction of the substrates 510 and 520, thereby raising or lowering a region in which the suction unit 613 is coupled.

Also, the plurality of actuators 612 is respectively coupled to the suction unit 613 via links. A central part of the suction unit 613 is coupled to the base unit 611 by a supporting column 614. When the actuators 612 are operated in the correction device 601, the surface of the suction unit 613 is displaced in the thickness direction in each of the regions in which the actuators 612 are coupled.

Figure 22:
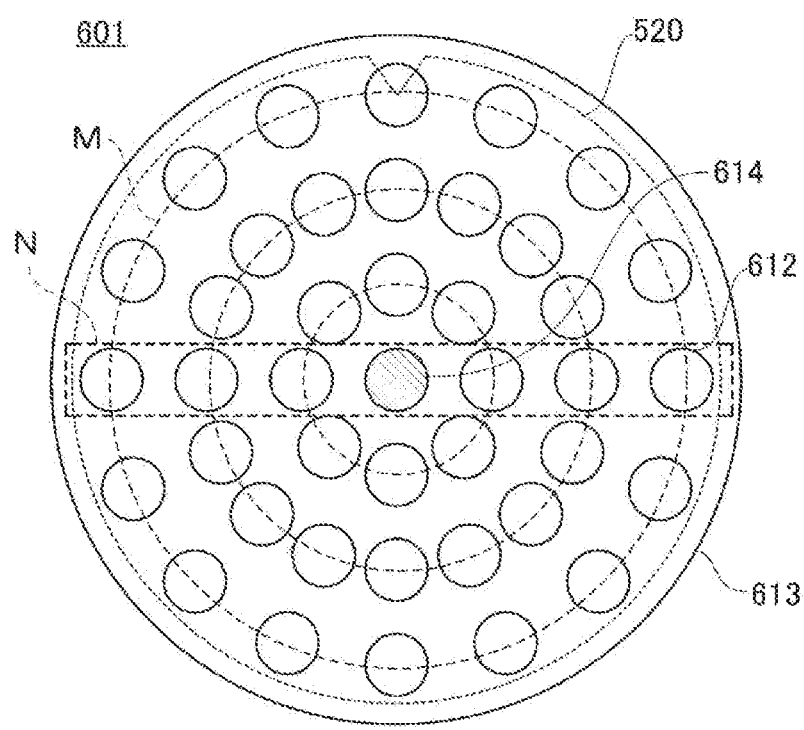
FIG. 22 is a schematic front view of the correction device 601.

FIG. 22 is a schematic plan view of the correction device 601, and shows a layout of the actuators 612 in the correction device 601. In the correction device 601, the actuators 612 are radially arranged about the supporting column 614. Also, it can be understood that the arrangement of the actuators 612 is regarded as a concentric circle of which a center is the supporting column 614. The arrangement of the actuators 612 is not limited to the shown arrangement. For example, the actuators may be arranged in a lattice shape, a spiral shape and the like. Thereby, the substrate 520 may be corrected by changing the shape thereof into a concentric circle, a radial shape, a spiral shape or the like.

Figure 23:
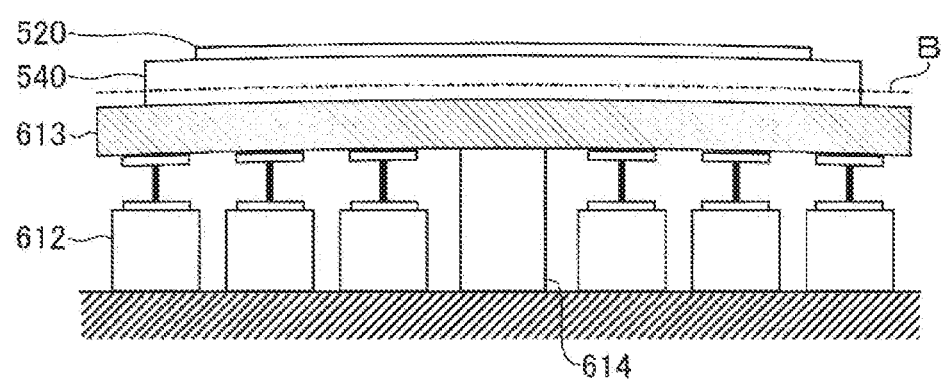
FIG. 23 is a schematic view illustrating an operation of the correction device 601.

FIG. 23 illustrates an operation of the correction device 601. As shown, the valves 616 can be individually opened and closed to extend and contract the actuators 612, thereby changing the shape of the suction unit 613. Therefore, in a state in which the suction unit 613 sucks the substrate holder 540 and the substrate holder 540 holds the substrate 520, the shape of the suction unit 613 is changed to change and flex the shapes of the substrate holder 540 and the substrate 520.

As shown in FIG. 22, the actuators 612 can be regarded as being arranged in a concentric circle shape, i.e., in a circumferential direction of the lower stage 332. Therefore, as shown with a dotted line M in FIG. 22, the actuators 612 on each circumference is grouped, and a drive amount is increased toward a circumferential edge, so that the center of the surface of the suction unit 613 is raised and can be thus changed into a shape such as a spherical surface, a parabolic shape, a cylindrical shape or the like.

Thereby, as with a case in which the substrate 520 is held on the flexed substrate holder 540, the substrate 520 can be flexed while changing its shape in conformity to a spherical surface, a parabolic shape or the like. Therefore, in the correction device 601, as compared to a central part B in the thickness direction of the substrate 520, which is shown with the one dot chain line in FIG. 23, a shape of the upper surface of the substrate 520 is changed so that the surface of the substrate 520 is expanded in a plane direction.

Also, a shape of the lower surface of the substrate 520 in FIG. 23 is changed so that the surface of the substrate 520 is reduced in the plane direction. Also, when the amounts of extension and contraction of the plurality of actuators 612 are individually controlled, the shape of the substrate 520 can be changed and flexed into a non-linear shape including a plurality of concave and convex portions, in addition to the other shapes such as a cylindrical shape.

In the example of FIG. 22, the suction unit 613 is convex at the center. However, the operating amounts of the actuators 612 at the peripheral edge portion of the suction unit 613 are increased to recess the central part with respect to the peripheral edge portion of the suction unit 613, so that the magnification of the circuit region 516 on the surface of the substrate 520 can be reduced.

Also, in the above example, the correction device 601 is incorporated into the lower stage 332 of the bonding device 300. However, the correction device 601 may be incorporated into the upper stage 322 so that the substrate 510 is to be corrected on the upper stage 322. Also, the correction device 601 may be incorporated into both the upper stage 322 and the lower stage 332. Also, the correction may be shared on the upper stage 322 and the lower stage 332. The correction of the magnifications of the substrates 510 and 520 is not limited to the above method, and other correction method such as thermal expansion and thermal shrinkage by temperature regulation may be additionally adopted. In this case, the temperature regulation may be performed by a device outside of the bonding device 300.

Also, when conveying the substrates 510 and 520 of which temperatures have been regulated to the bonding device 300, a conveying path may be set to an adiabatic environment. Also, a temperature distribution of the hand holding the substrates 510 and 530 of a conveyor unit that conveys the substrates 510 and 530 may be set to be the same as the temperature distributions of the substrates 510 and 530 of which temperatures have been regulated. Also, a temperature upon the temperature regulation may be set, considering heat that is irradiated from the substrates 510 and 530 during the conveying. Also, temperature distributions of the upper stage 322 and the lower stage 332 in which the substrates 510 and 530 are carried may be set to be the same as the temperature distributions of the substrates 510 and 530 of which temperatures have been regulated.

In this way, the correction device 601 can immediately cope with a variety of corrections by controlling the actuators 612 to change the shape of the suction surface. Therefore, it is possible to favorably use the correction device when correcting the plurality of substrates 520 with individual conditions. Also, it is possible to correct the non-linear distortion in the substrate 520 by individually operating the actuators 612 of the correction device 601 through the control device 130.

In the meantime, when bonding one deformed substrate 520 to the other substrate 510, since stress due to deformation is also generated in the substrate 520 on the fixed side on which the holding state is not released, in accordance with stress that is generated in the substrate 510 on the release side on which the holding state by substrate holder 530 is released upon the bonding, a difference in stress between the substrates is small in the state of the stacked substrate 550 after the bonding.

In the meantime, in the stacked substrate 550 in which the substrates of which the magnification or the non-linear distortion has been corrected in the patterning by the circuit forming device 200 are bonded, the stress due to the distortion generated in the bonding process remains in the substrate 510 on the release side. However, since the substrate 520 on the fixed side is not subjected to deformation for distortion correction, the stress due to the deformation is not generated therein. For this reason, when the holding state of the substrate 520 on the substrate holder 540 is released after the bonding, the stress is distributed in both the substrates. For this reason, the substrate 520 is reduction deformed together with the substrate 510 due to the stress applied from the substrate 510. In this state, the positions of the patterns formed on the substrates 510 and 520 largely deviate from the design positions.

Thereafter, the substrate 510 is thinned, so that the stress is again concentrated on the substrate 510. For this reason, the substrates 510 and 520 are respectively enlargement-deformed, so that the pattern positions on the substrates 510 and 520 substantially coincide with the design positions. Thereby, upon the exposure of a redistribution layer after the thinning of the substrate 510 or upon the stacking of the third and subsequent substrates, a post-process can be performed by using the design positions as target positions. Therefore, when the substrate on which the stacked substrate 550 is thinned after the bonding is confirmed in advance, it is preferably to correct the distortion that is generated in the substrate to be thinned in the processing unit 11.

Also, in the above example, the lower stage 332 is deformed by the actuators 612, so that at least one of the substrates 510 and 520 is deformed and corrected. However, for example, as shown in FIG. 9, the plurality of substrate holders 540 having curved suction surfaces 542 and different curvatures may be prepared, and the substrate 520 may be deformed, i.e., corrected by holding the substrate 520 with the substrate holder 540 having a curvature corresponding to the correction conditions for the substrate 520. When at least one of the two substrates 510 and 520 is deformed to reduce the positional misalignment between the substrates to the threshold value or smaller, an amount of deformation thereof is the correction amount.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: manufacturing device, 11: processing unit, 12: second measuring unit, 13: stacking unit, 14: measuring unit, 100: film depositing device, 110: chamber, 112: supply hole, 114: exhaust hole, 122, 124: high-frequency electrode, 130: control device, 131: common correction control unit, 132: individual correction control unit, 133: decision unit, 134: determination unit, 200: circuit forming device, 210: light source. 220: reticle, 230: reduction optics, 240: moving stage. 300: bonding device. 310: frame body, 312: bottom plate, 316: top plate, 322: upper stage, 324, 334: microscope, 326, 336: activation device, 331: X-direction drive unit, 332: lower stage, 333: Y-direction drive unit, 338: elevation drive unit, 339: rotation drive unit. 400: thinning device, 510, 520: substrate, 512, 522: scribe line, 514, 524: notch, 516, 526: circuit region, 518, 528: alignment mark, 530, 540: substrate holder, 532, 542: suction surface, 550: stacked substrate, 601: correction device, 611: base unit, 612: actuator, 613: suction unit, 614: supporting column, 615: pump, 616: valve

What is claimed is:

1. A method for manufacturing a stacked substrate comprising:
   processing at least one of a plurality of substrates with a processing unit;
   stacking at least two of the plurality of substrates with a stacking unit to manufacture the stacked substrate;
   firstly measuring the stacked substrate;
   secondly measuring the at least one of the plurality of substrates processed in the processing;
   controlling the processing unit in accordance with a first correction condition calculated based on a measurement result in the firstly measuring and a measurement result in the secondly measuring, to process another at least one substrate different from the at least one of the plurality of substrates; and
   controlling the stacking unit in accordance with a second correction condition calculated based on the measurement result in the firstly measuring and the measurement result in the secondly measuring, the second correction condition being different from the first correction condition, to stack another at least two substrates of the plurality of substrates different from the at least two of the plurality of substrates, wherein the another at least two substrates includes the another at least one substrate.

2. The method according to claim 1, wherein
the stacking of the another at least two substrates includes correcting at least a part of a positional misalignment among the plurality of substrates, and
a correction amount of the stacking of the another at least two substrates is decided based on the measurement result in the firstly measuring and the measurement result in the secondly measuring.

3. The method according to claim 2, wherein the correction amount of the stacking is decided in each of a plurality of measurement results in the firstly measuring and the secondly measuring.

4. The method according to claim 1, wherein the secondly measuring includes measuring a distortion of the at least one of the plurality of substrates.

5. The manufacturing method according to claim 1, further comprising measuring the stacked substrate, wherein the processing for at least one of a plurality of substrates to be stacked after the measuring is controlled based on the measurement result in the measuring the stacked substrate.

6. The manufacturing method according to claim 5, wherein
a correction amount for a substrate processed in the processing after the plurality of the substrates is decided based on the measurement result in the measuring the stacked substrate.

7. The manufacturing method according to claim 6, wherein
a second correction amount of the stacking is decided based on a second measuring result of the substrate processed with the correction amount.

8. The method according to claim 1, further comprising deciding a correction amount to be performed in the processing of the another at least one substrate based on an amount of positional misalignment among a different plurality of substrates of each of a plurality of stacked substrates manufactured before manufacturing the stacked substrate.

9. The method according to claim 8, wherein in the deciding, one of an average value and a minimum value of the amounts of positional misalignment in the plurality of stacked substrates is decided as the correction amount.

10. The method according to claim 8, wherein in the deciding, a 3σ (σ: standard deviation) of each of positional misalignment components of the amount of positional misalignment in each stacked substrate of the plurality of stacked substrates is calculated, and a correction amount for correcting a positional misalignment component of which a value of the 3σ is smaller than a preset threshold value is decided as the correction amount.

11. The method according to claim 1, wherein in the processing of the another at least one substrate, the correction is performed in forming a circuit on the another at least one substrate.

12. The method according to claim 1, wherein in the processing of the another at least one substrate, the correction is performed in depositing a film on the another at least one substrate.

13. The method according to claim 1, wherein in the stacking of the another at least two substrates, the correction is performed by deforming the another at least one substrate.

14. The method according to claim 8, wherein the positional misalignment in the deciding includes positional misalignment that is generated in the stacked substrate during a thinning in which the stacked substrate is thinned after the stacking.

15. The method according to claim 1, wherein the first correction condition is used for correcting, during the processing of the another at least one substrate, at least a part of a positional misalignment generated among the stacked plurality of substrates during the stacking of the plurality of substrates, and the second correction condition is used for correcting, during the stacking of the another at least two substrates, a part of a remainder of the positional misalignment.

16. The method according to claim 1, wherein the first correction condition in the processing of the another at least one substrate and the second correction condition in the stacking of the another at least two substrates include a correction amount,
   wherein the correction amount in the processing is common for the another at least one substrate processed in the processing, and wherein the correction amount in the stacking corresponds to a difference between an amount of positional misalignment that is generated among the stacked plurality of substrates measured by the firstly measuring and the correction amount in the processing commonly decided.

17. The method according to claim 1, wherein the first correction condition is commonly used for the another at least one substrate processed in the processing.

18. The method according to claim 1, wherein the first correction condition is decided based on a plurality of measurement results that are obtained by measuring a plurality of stacked substrates during the firstly measuring.

19. The method according to claim 1, wherein the secondly measuring includes measuring a distortion of the at least one of the plurality of substrates processed in the processing.

20. The method according to claim 1, wherein at least a part of a positional misalignment that is generated among the plurality of substrates is corrected during the stacking of the another at least one substrate, and the second correction condition is decided based on the measurement result in the secondly measuring.

21. The method according to claim 20, wherein the second correction condition is decided for each measurement result in the secondly measuring.

22. The method according to claim 16, wherein the correction amount in the processing of the another at least one substrate is decided such that a remaining correction amount after the correction during the processing is a range to be correctable in the stacking.

23. The method according to claim 22, wherein the correction amount in the stacking of the another at least one substrate is obtained by excluding information regarding the measurement result in the secondly measuring from information regarding the measurement result in the firstly measuring.

24. The method according to claim 23, wherein the firstly measuring includes measuring the positional misalignment that is generated among the stacked plurality of substrates,
the secondly measuring includes measuring a distortion of at least one of the plurality of substrates,
the correction amount in the stacking of the another at least one substrate is decided based on the measurement result in the secondly measuring, and
a distortion component of substrate that is generated in the stacking of the another at least two substrates is calculated by excluding information regarding the distortion of at least one of the plurality of substrates measured by the secondly measuring from the positional misalignment that is generated among the stacked plurality of substrates measured by the firstly measuring.

25. The method according to claim 1, wherein the processing of the at least one of a plurality of substrates includes processing a structure including a mark to at least one of the plurality of substrates;
the stacking of the at least two of the plurality of substrates includes detecting the mark provided in the substrate, the plurality of substrates being stacked based on a detection result of the mark, and
the secondly measuring includes measuring the substrate before entering the stacking to obtain a displacement from a design position of the structure in the substrate.

* * * * *